United States Patent
Miyagawa et al.

(10) Patent No.: US 10,249,565 B2
(45) Date of Patent: *Apr. 2, 2019

(54) SEMICONDUCTOR DEVICE THAT TRANSFERS AN ELECTRIC SIGNAL WITH A SET OF INDUCTORS

(71) Applicant: Renesas Electronics Corporation, Tokyo (JP)

(72) Inventors: Yuichi Miyagawa, Tokyo (JP); Hideki Fujii, Tokyo (JP); Kenji Furuya, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/247,128

(22) Filed: Aug. 25, 2016

(65) Prior Publication Data

US 2016/0365316 A1 Dec. 15, 2016

Related U.S. Application Data

(63) Continuation of application No. 14/458,709, filed on Aug. 13, 2014, now Pat. No. 9,461,103, which is a
(Continued)

(30) Foreign Application Priority Data

Aug. 6, 2010 (JP) .................................. 2010-178012
Jun. 6, 2011 (JP) .................................. 2011-126543

(51) Int. Cl.
*H01L 21/56* (2006.01)
*H01L 23/522* (2006.01)
(Continued)

(52) U.S. Cl.
CPC ...... *H01L 23/5227* (2013.01); *H01L 21/4853* (2013.01); *H01L 21/4882* (2013.01);
(Continued)

(58) Field of Classification Search
CPC .................. H05K 2201/10734; H01L 23/5227
See application file for complete search history.

(56) References Cited

U.S. PATENT DOCUMENTS 5,373,112 A  12/1994 Kamimura et al.
6,562,674 B1  5/2003 Tsuura
(Continued)

FOREIGN PATENT DOCUMENTS

JP  2003-152132  5/2003
JP  2005-005685  1/2005
(Continued)

OTHER PUBLICATIONS

Japanese Office Action dated Sep. 9, 2014 in corresponding Japanese Patent Application No. 2011-126543.
(Continued)

*Primary Examiner* — Thao X Le
*Assistant Examiner* — Laura M Dykes
(74) *Attorney, Agent, or Firm* — Young & Thompson

(57) ABSTRACT

A semiconductor chip is mounted on a first surface of an interconnect substrate, and has a multilayer interconnect layer. A first inductor is formed over the multilayer interconnect layer, and a wiring axis direction thereof is directed in a horizontal direction to the interconnect substrate. A second inductor is formed on the multilayer interconnect layer, and a wiring axis direction thereof is directed in the horizontal direction to the interconnect substrate. The second inductor is opposite to the first inductor. A sealing resin seals at least the first surface of the interconnect substrate and the semiconductor chip. A groove is formed over the
(Continued)

whole area of a portion that is positioned between the at least first inductor and the second inductor of a boundary surface of the multilayer interconnect layer and the sealing resin.

14 Claims, 49 Drawing Sheets

Related U.S. Application Data continuation of application No. 13/196,268, filed on Aug. 2, 2011, now Pat. No. 8,823,134.

(51) Int. Cl.
| | |
|---|---|
| *H01L 23/433* | (2006.01) |
| *H01L 49/02* | (2006.01) |
| *H01L 23/552* | (2006.01) |
| *H01L 23/00* | (2006.01) |
| *H01L 23/48* | (2006.01) |
| *H01L 23/12* | (2006.01) |
| *H01L 23/28* | (2006.01) |
| *H01L 21/48* | (2006.01) |
| *H01L 21/78* | (2006.01) |
| *H01L 23/31* | (2006.01) |
| *H01L 23/498* | (2006.01) |
| *H01L 25/07* | (2006.01) |
| *H01L 25/00* | (2006.01) |
| *H01L 23/50* | (2006.01) |

(52) U.S. Cl.
CPC .......... *H01L 21/561* (2013.01); *H01L 21/565* (2013.01); *H01L 21/78* (2013.01); *H01L 23/12* (2013.01); *H01L 23/28* (2013.01); *H01L 23/3114* (2013.01); *H01L 23/4334* (2013.01); *H01L 23/48* (2013.01); *H01L 23/49811* (2013.01); *H01L 23/49844* (2013.01); *H01L 23/552* (2013.01); *H01L 23/564* (2013.01); *H01L 24/75* (2013.01); *H01L 24/97* (2013.01); *H01L 25/072* (2013.01); *H01L 25/50* (2013.01); *H01L 28/10* (2013.01); *H01L 23/3121* (2013.01); *H01L 23/49838* (2013.01); *H01L 23/50* (2013.01); *H01L 24/16* (2013.01); *H01L 24/29* (2013.01); *H01L 24/32* (2013.01); *H01L 24/48* (2013.01); *H01L 24/49* (2013.01); *H01L 24/73* (2013.01); *H01L 2224/05571* (2013.01); *H01L 2224/05573* (2013.01); *H01L 2224/16225* (2013.01); *H01L 2224/16227* (2013.01); *H01L 2224/2919* (2013.01); *H01L 2224/29139* (2013.01); *H01L 2224/32225* (2013.01); *H01L 2224/32245* (2013.01); *H01L 2224/48091* (2013.01); *H01L 2224/48225* (2013.01); *H01L 2224/48227* (2013.01); *H01L 2224/48245* (2013.01); *H01L 2224/48247* (2013.01); *H01L 2224/49175* (2013.01); *H01L 2224/73204* (2013.01); *H01L 2224/73253* (2013.01); *H01L 2224/73265* (2013.01); *H01L 2224/7598* (2013.01); *H01L 2224/75745* (2013.01); *H01L 2224/97* (2013.01); *H01L 2924/00014* (2013.01); *H01L 2924/10157* (2013.01); *H01L 2924/10253* (2013.01); *H01L 2924/12041* (2013.01); *H01L 2924/12042* (2013.01); *H01L 2924/15151* (2013.01); *H01L 2924/15311* (2013.01); *H01L 2924/181* (2013.01); *H01L 2924/1815* (2013.01); *H01L 2924/3025* (2013.01)

(56) References Cited

U.S. PATENT DOCUMENTS

| | | | |
|---|---|---|---|
| 6,979,894 | B1 | 12/2005 | Sutardja |
| 7,525,185 | B2 | 4/2009 | Yang et al. |
| 7,557,443 | B2 | 7/2009 | Ye et al. |
| 7,888,808 | B2 | 2/2011 | Suzuki et al. |
| 8,004,062 | B2 | 8/2011 | Nakashiba |
| 8,354,732 | B2 | 1/2013 | Nakashiba |
| 8,399,960 | B2 | 3/2013 | Nakashiba |
| 8,507,318 | B2 | 8/2013 | Ye et al. |
| 8,525,295 | B2 | 9/2013 | Nakashiba |
| 8,823,159 | B2 | 9/2014 | Ye et al. |
| 9,461,103 | B2* | 10/2016 | Miyagawa ............ H01L 21/561 |
| 2003/0179556 | A1 | 9/2003 | Zhao et al. |
| 2004/0227608 | A1 | 11/2004 | Nakatani et al. |
| 2005/0003562 | A1 | 1/2005 | Bhatt et al. |
| 2007/0001316 | A1* | 1/2007 | Choi ................. H01L 23/49838 |
| | | | 257/779 |
| 2008/0029907 | A1* | 2/2008 | Koduri .................. H01F 17/045 |
| | | | 257/784 |
| 2008/0151484 | A1 | 6/2008 | Suzuki et al. |
| 2008/0185709 | A1* | 8/2008 | Ishihara ................. H01L 23/16 |
| | | | 257/698 |
| 2009/0230938 | A1 | 9/2009 | Sakurai |
| 2011/0006443 | A1 | 1/2011 | Noguchi et al. |
| 2011/0012228 | A1* | 1/2011 | Nakagawa ............. H01L 23/48 |
| | | | 257/531 |
| 2015/0137364 | A1 | 5/2015 | Ye et al. |

FOREIGN PATENT DOCUMENTS

| | | |
|---|---|---|
| JP | 2006-66769 | 3/2006 |
| JP | 2007-123649 | 5/2007 |
| JP | 2007-123650 | 5/2007 |
| JP | 2008-159758 | 7/2008 |
| JP | 2008-258604 A | 10/2008 |
| JP | 2009-508324 | 2/2009 |
| JP | 2009-219294 | 9/2009 |
| JP | 2009-295804 | 12/2009 |
| JP | 2015-099928 | 5/2015 |
| WO | 2009-113372 | 9/2009 |
| WO | 2009/113372 A1 | 9/2009 |
| WO | 2009-113373 | 9/2009 |

OTHER PUBLICATIONS

Japanese Official Action—2015-203759—dated Dec. 6, 2016.
Japanese Office Action for Application No. 2017-192504, dated May 15, 2018.
Japanese Official Action—JP2015-203759—dated Dec. 5, 2017.
Japanese Office Action for Application No. 2015-203759, dated Jul. 31, 2018, with English translation provided.
Japanese Official Action issued in Application No. 2015-203759, dated Oct. 23, 2018, with English Translation.

* cited by examiner

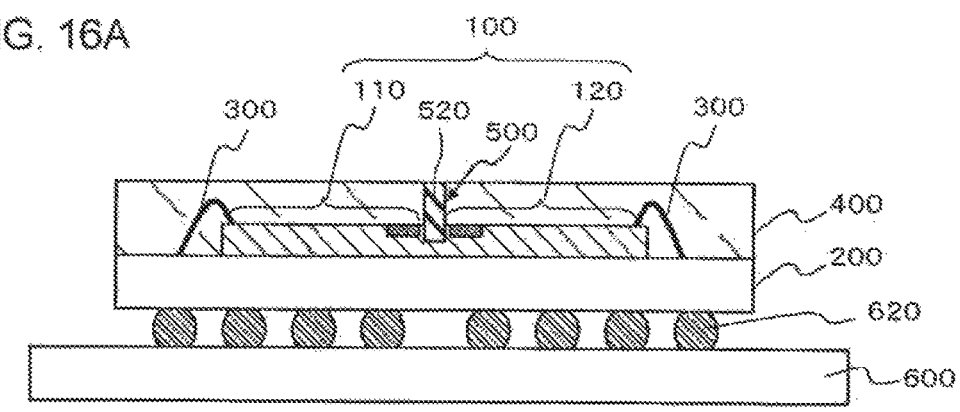
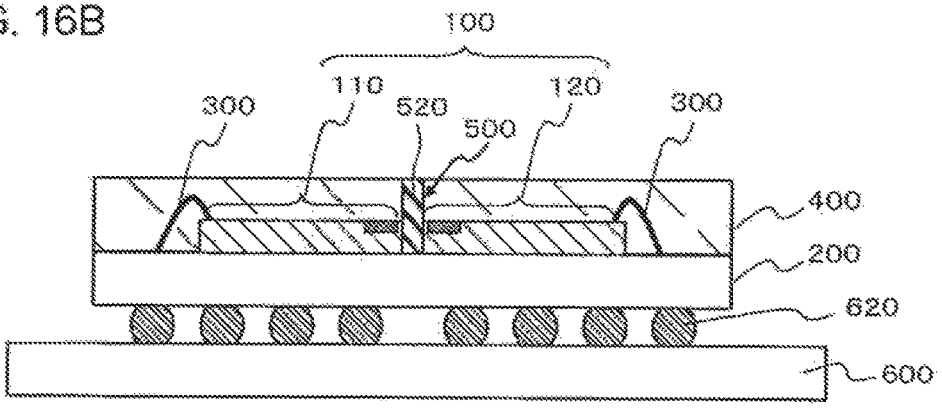

SEMICONDUCTOR DEVICE THAT TRANSFERS AN ELECTRIC SIGNAL WITH A SET OF INDUCTORS

This application is based on Japanese patent application NOs. 2010-178012 and 2011-126543, the contents of which are incorporated hereinto by reference.

BACKGROUND

Technical Field

The invention relates to a semiconductor device that transmits and receives a signal using an inductor, an electronic apparatus, and a method of manufacturing a semiconductor device.

Related Art

In the case where an electric signal is transferred between two circuits having different electric potentials of input electric signals, a photocoupler is frequently used. The photocoupler has a light emitting element such as a light emitting diode and a light receiving element such as a phototransistor, and transfers an electric signal by converting the input electric signal into light in the light emitting element and returning the light to the electric signal in the light receiving element. However, since the photocoupler has the light emitting element and the light receiving element, miniaturization thereof is difficult. Further, in the case where the electric signal has a high frequency, the photocoupler is unable to follow the electric signal. As a technique for solving this problem, a technique of transferring an electric signal by arranging two (one set of) inductors to face each other and inductively coupling the respective inductors to each other has been developed.

In Japanese Laid-open patent publication NO. 2006-066769 and Japanese Laid-open patent publication NO. 2005-005685, two (one set of) inductors, that is, vertical (FIG. 1) and horizontal (FIG. 2) inductors, are arranged to face each other in one semiconductor chip using a multilayer interconnect of the semiconductor chip. They may be manufactured in a standard CMOS process, and the positional precision of the two inductors arranged to face each other can be heightened.

Further, a semiconductor device described in Japanese Laid-open patent publication NO. 2007-123650 and Japanese Laid-open patent publication NO. 2007-123649 has a first inductor and a second inductor. In this semiconductor device, input and output signal terminals are isolated from each other. The first inductor is installed in a first semiconductor chip, and generates an electromagnetic signal based on the electric signal input to an input unit. Further, the second semiconductor inductor is installed in a second semiconductor chip, generates an electric signal through reception of the electromagnetic signal from the first inductor, and outputs the generated electric signal through an output unit. The first semiconductor chip and the second semiconductor chip are installed on respective lead frames, and are arranged to face each other in a state where the first and second inductors are electrically isolated from each other. Accordingly, the first inductor and the second inductor are not in electrical contact with each other, and thus it becomes possible to easily achieve isolation between the first inductor and the second inductor. Further, since no thick isolation layer is installed between the inductors, it is possible to manufacture the semiconductor device in a standard CMOS process.

SUMMARY

In the case of performing transmission and reception of energy using inductors, it is required to make two inductors face each other with good precision in order to heighten efficiency. For this, it is preferable to form the first inductor and the second inductor on the same substrate. The inventor examined the fact that the winding axis direction of the first inductor and the second inductor was directed in the horizontal direction to the substrate, and in this case, the inventor considered that there was a possibility of a problem occurring in the isolation between the first inductor and the second inductor.

In one embodiment, there is provided a semiconductor device including an interconnect substrate; a semiconductor chip mounted over a first surface of the interconnect substrate and having a multilayer interconnect layer; a first inductor formed in the multilayer interconnect layer, a wiring axis direction of the first inductor being directed in a horizontal direction to the interconnect substrate; a second inductor formed in the multilayer interconnect layer and facing the first inductor, a wiring axis direction of the second inductor being directed in the horizontal direction to the interconnect substrate; and a groove formed over the multilayer interconnect layer and positioned between the first inductor and the second inductor.

According to this embodiment, a groove is formed over a boundary surface between a sealing resin and the multilayer interconnect layer. This groove is formed over the whole area of at least a portion that is positioned between the first inductor and the second inductor. This allows preventing the insulation between the first inductor and the second inductor from being unable to be secured is suppressed.

In another embodiment, there is provided an electronic apparatus including a semiconductor device; and a mount substrate mounting the semiconductor device; wherein the semiconductor device includes an interconnect substrate; a semiconductor chip mounted over a first surface of the interconnect substrate and having a multilayer interconnect layer; a first inductor formed in the multilayer interconnect layer, a wiring axis direction of the first inductor being directed in a horizontal direction to the interconnect substrate; a second inductor formed in the multilayer interconnect layer and facing the first inductor, a wiring axis direction of the second inductor being directed in the horizontal direction to the interconnect substrate; and a groove formed over the multilayer interconnect layer and positioned between the first inductor and the second inductor.

In still another embodiment, there is provided a method of manufacturing a semiconductor device including forming a semiconductor device having a substrate, a multilayer interconnect layer formed over the substrate, a first inductor formed in the multilayer interconnect layer, a wiring axis direction of the first inductor being directed in a horizontal direction to the substrate, and a second inductor formed in the multilayer interconnect layer and facing the first inductor, a wiring axis direction of the second inductor being directed in the horizontal direction to the interconnect substrate; and forming a groove over the multilayer interconnect layer and positioned between the first inductor and the second inductor.

The above-described embodiments allow preventing the insulation between the first inductor and the second inductor from being unable to be secured.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 16A and 16B are schematic cross-sectional views of an electronic apparatus according to a sixth embodiment;

DETAILED DESCRIPTION

Figure 1:
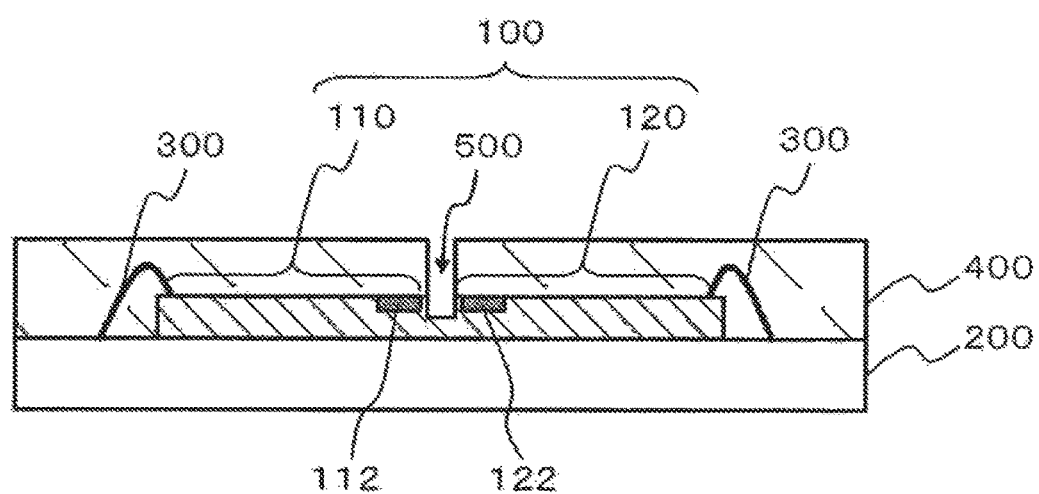
FIG. 1 is a cross-sectional view illustrating the configuration of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the invention will be described using drawings. In the drawings, the same reference numerals are used for the same constituent elements, and the description thereof will not be repeated.

(First Embodiment)

FIG. 1 is a cross-sectional view illustrating the configuration of a semiconductor device according to a first embodiment. This semiconductor device includes an interconnect substrate 200, a semiconductor chip 100, a first inductor 112, a second inductor 122, a sealing resin 400, and a groove 500. A semiconductor chip 100 is mounted on a first surface of the interconnect substrate 200, and has a multilayer interconnect layer 106 (illustrated in FIG. 2). The first inductor 112 is formed in the multilayer interconnect layer 106, and the wiring axis direction of the first inductor 112 is directed in a horizontal direction to the interconnect substrate 200. The second inductor 122 is formed in the multilayer interconnect layer 106, and the wiring axis direction of the second inductor 122 is directed in the horizontal direction to the interconnect substrate 200. The second inductor 122 faces the first inductor 112. The sealing resin 400 seals the semiconductor chip 100 and at least a first surface of the interconnect substrate 200. The groove 500 is formed over the whole area of at least a portion, which is positioned between the first inductor 112 and the second inductor 122, of a boundary surface between the sealing resin 400 and the multilayer interconnect layer 106. Hereinafter, this will be described in detail.

A surface of the semiconductor chip 100, on which the multilayer interconnect layer 106 is formed, that is, an active surface, is directed opposite to the interconnect substrate 200. The semiconductor chip 100 is connected to the interconnect substrate 200 through a bonding wire 300. The sealing resin 400 seals the first surface of the interconnect substrate 200, the bonding wire 300, and the whole semiconductor chip 100. Further, the groove 500 is formed over a range from an upper surface of the sealing resin 400 to the multilayer interconnect layer 106 of the semiconductor chip 100. The groove 500 does not penetrate the semiconductor chip 100. It is preferable that the groove 500 penetrates, in the multilayer interconnect layer 106 of the semiconductor chip 100, a layer in which at least the first inductor 112 and the second inductor 122 are formed. More preferably, the groove 500 penetrates the whole multilayer interconnect layer 106. In this embodiment, the first inductor 112 and the second inductor 122 are formed on the same layer.

The first inductor 112 is formed in a first circuit area 110 of the semiconductor chip 100, and the second inductor 122 is formed in a second circuit area 120 of the semiconductor chip 100. The number of windings and the winding direction of the first inductor 112 may be equal to or may be different from those of the second inductor 122. The first circuit area 110 has an oscillation circuit, and the second circuit area 120 has a reception circuit. The oscillation circuit is connected to the first inductor 112, and the reception circuit is connected to the second inductor 122. The first circuit area 110 (including the first inductor 112) is inputted a different reference electric potential from that of the second circuit area 120 (including the second inductor 122) when they are driven. The difference in reference electric potential between the first circuit area 110 and the second circuit area 120 is, for example, equal to or more than 100V. For example, the reference electric potential of the first circuit area 110 is about 3V, and the electric potential of the second circuit area 120 is about 800V. Further, the circuit formed in the first circuit area 110 and the circuit formed in the second circuit area 120 may transmit and receive signals through the first inductor 112 and the second inductor 122.

Figure 2:
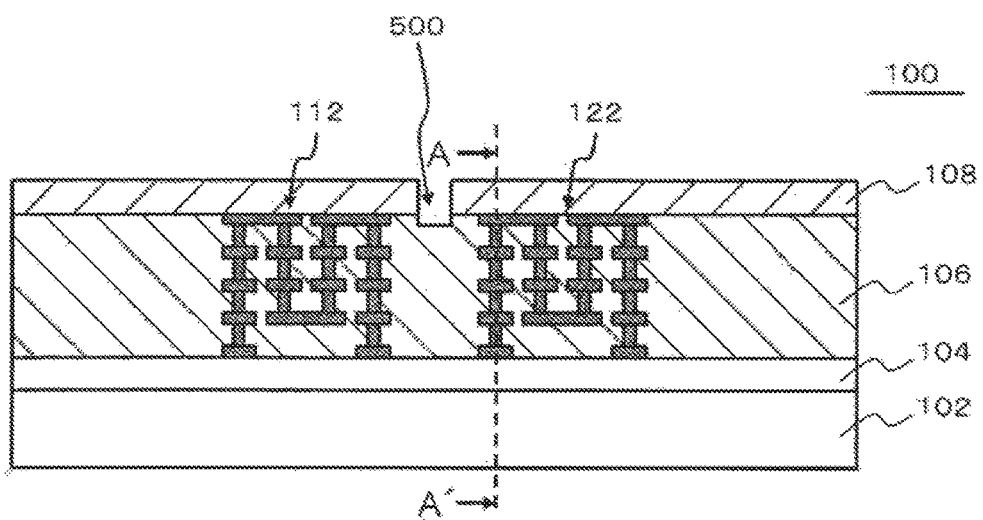
FIG. 2 is an enlarged cross-sectional view illustrating the configuration of a semiconductor chip.

FIG. 2 is an enlarged cross-section view illustrating the configuration of the semiconductor chip 100. The semiconductor chip 100 has an element layer 104, on which elements are formed, provided on the substrate 102 such as a silicon substrate. The elements provided on the element layer 104 are, for example, transistors. The multilayer interconnect layer 106 is formed on the element layer 104. The uppermost layer of the multilayer interconnect layer 106 is a passivation film 108. The first inductor 112 and the second inductor 122 are connected to the element of the element layer 104. In this embodiment, the first inductor 112 and the second inductor 122 are formed by using the whole interconnect layer that is formed in the multilayer interconnect layer 106.

Figure 3A:
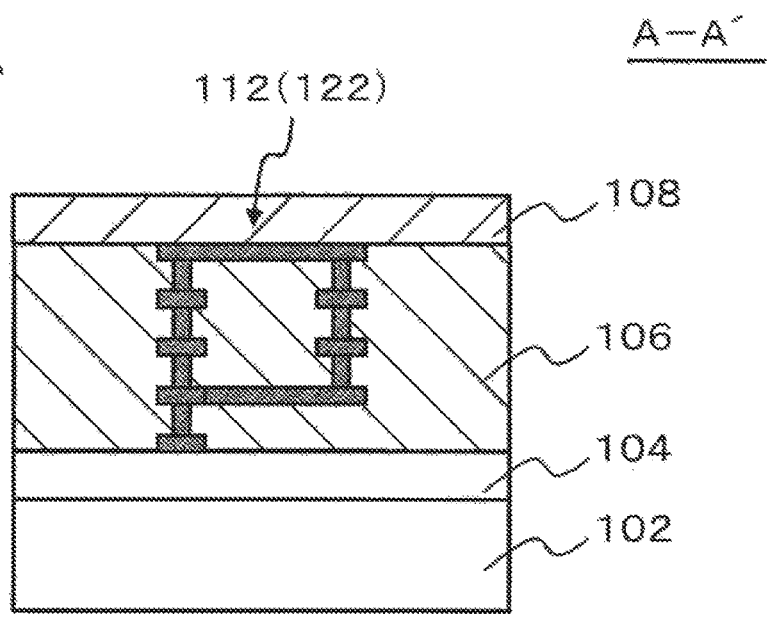
FIGS. 3A and 3B are cross-sectional views taken along ling A-A' in FIG. 2.

FIG. 3A is a cross-sectional view taken along line A-A' in FIG. 2. As illustrated in this drawing and FIG. 2, the first inductor 112 and the second inductor 122 are three-dimensionally formed, and have a spiral shape. In an example illustrated in FIG. 2, the first inductor 112 and the second inductor 122 have quadruple spirals. The planar shapes of respective loops that constitute the spirals are equal to each other.

Figure 3B:
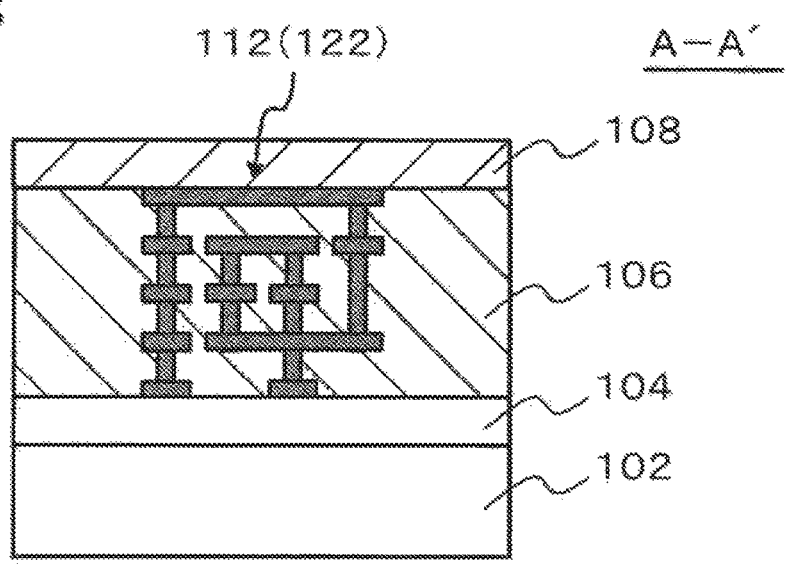

FIG. 3B is a cross-section view illustrating a modified example of the shapes of the first inductor 112 and the second inductor 122. In an example illustrated in this drawing, the first inductor 112 and the second inductor 122 are two-dimensionally formed except for a portion that is connected to the element of the element layer 104. That is, in an example illustrated in this drawing, the main body portions of the first inductor 112 and the second inductor 122 are stretched to form the spiral within the same surface.

Figure 4A:
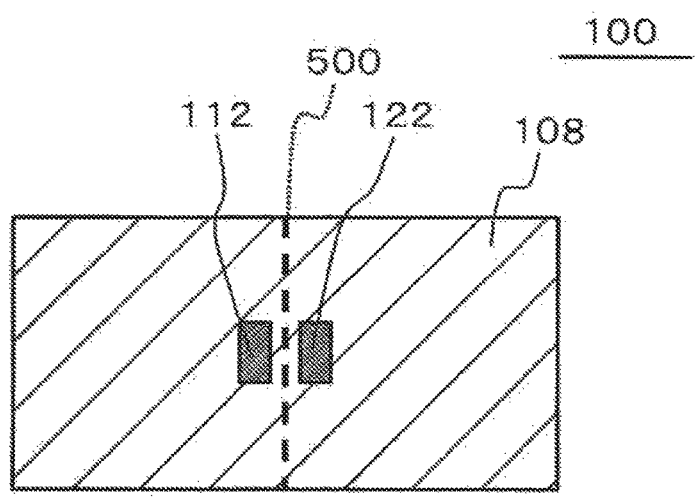
FIGS. 4A and 4B are schematic plan views illustrating widths of a first inductor and a second inductor.
Figure 4B:
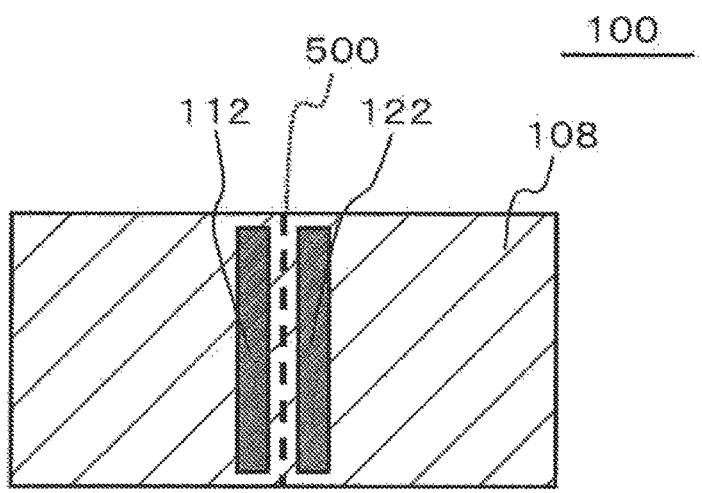

FIGS. 4A and 4B are schematic plan views illustrating widths of the first inductor 112 and the second inductor 122. The first inductor 112 and the second inductor 122, as seen in the width direction of the semiconductor chip 100, may be formed on a portion of the semiconductor chip 100 as illustrated in FIG. 4A or may be formed on the whole semiconductor chip 100 except for ends of the semiconductor chip 100 as illustrate in FIG. 4B. However, even in the case of a structure illustrated in FIG. 4B, the first inductor 112 and the second inductor 122 are positioned inside a guard ring (not illustrated) in the width direction (upward and downward directions in the drawing) of the semiconductor chip 100. In this case, a guard ring and a interconnect are formed neither between the first inductor 112 and the groove 500 nor between the second inductor 122 and the groove 500.

Figure 5A:
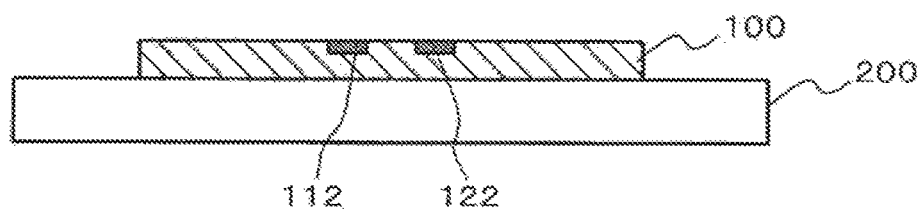
FIGS. 5A and 5B are cross-sectional views illustrating a method of manufacturing a semiconductor drive illustrated in FIG. 1.

FIGS. 5A and 5B and 6A and 6B are cross-sectional views illustrating a method of manufacturing a semiconductor device illustrated in FIG. 1. First, as illustrated in FIG. 5A, the semiconductor chip 100 is prepared. In this stage, the semiconductor chip 100 has the first inductor 112 and the second inductor 122. The semiconductor chip 100 is prepared as follows. First, an element isolation region is formed on a semiconductor substrate such as a silicon wafer. Then, a gate insulating layer and a gate electrode are formed on the semiconductor substrate. Then, an extension area is formed on the semiconductor substrate, and a side wall is further formed on a side wall of the gate electrode. Then, a source and a drain are formed on the semiconductor substrate. Accordingly, a transistor is formed on the semiconductor substrate. Then, the multilayer interconnect layer 106 is formed on the semiconductor substrate and the transistor. Thereafter, as necessary, the semiconductor substrate is separated into individual semiconductor chips 100.

Then, the semiconductor chip 100 is mounted on the interconnect substrate 200 by using, for example, paste, nonconductive adhesive, or Die Attach Film (DAF) (not illustrated). At this time, the active surface of the semiconductor chip 100 is directed opposite to the interconnect substrate 200.

Figure 5B:
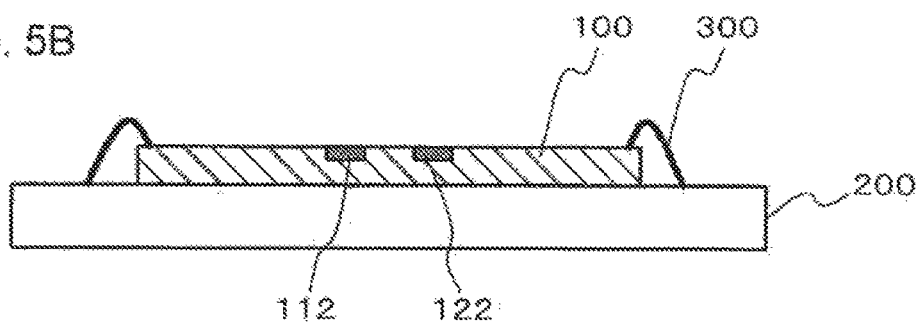

Then, as illustrated in FIG. 5B, the semiconductor chip 100 and the interconnect substrate 200 are connected together using a bonding wire 300.

Figure 6A:
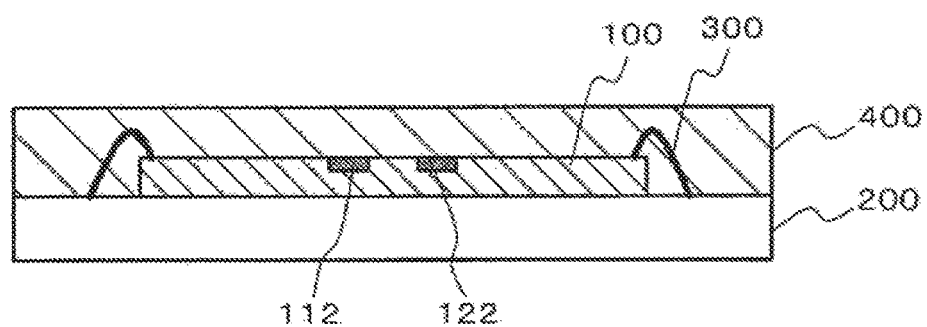
FIGS. 6A and 6B are cross-sectional views illustrating a method of manufacturing a semiconductor drive illustrated in FIG. 1.

Then, as illustrated in FIG. 6A, the first surface of the interconnect substrate 200, the bonding wire 300, and the semiconductor chip 100 are sealed using the sealing resin 400. The sealing resin 400 is also formed on the multilayer interconnect layer 106 of the semiconductor chip 100. The sealing resin is formed using a mold (not illustrated), and the upper surface of the sealing resin 400 is evenly formed.

Figure 6B:
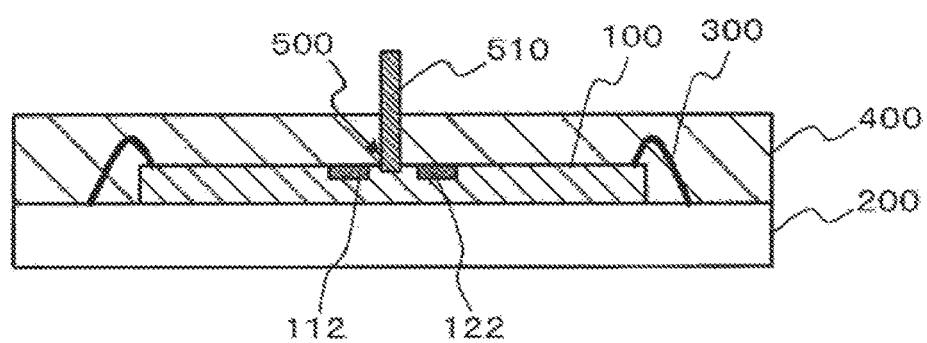

Then, as illustrated in FIG. 6B, using a dicing blade 510, the groove 500 is formed from the upper surface of the sealing resin 400 toward the multilayer interconnect layer 106. In this case, the method of forming the groove 500 is not limited to the method using the dicing blade 510.

Figure 7:
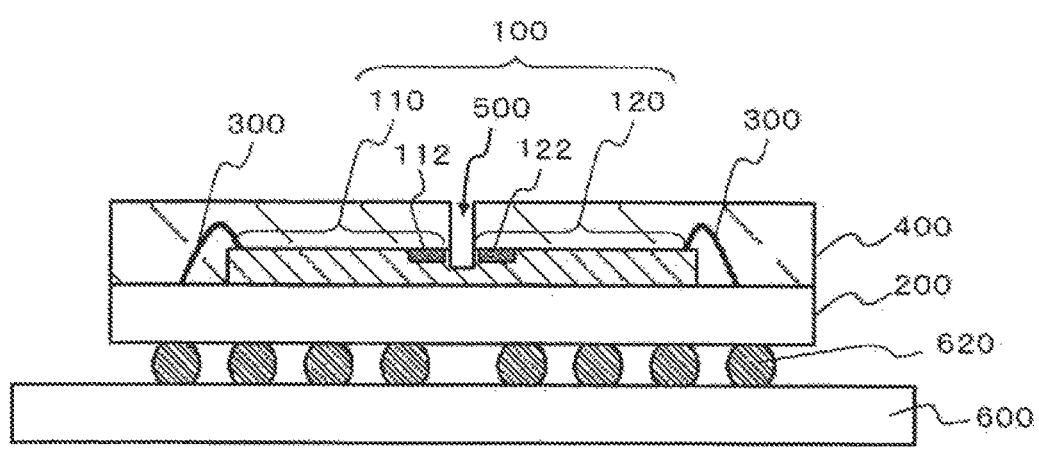
FIG. 7 is a cross-sectional view of an electronic apparatus using a semiconductor device illustrated in FIG. 1.

FIG. 7 is a cross-sectional view of an electric device using a semiconductor device illustrated in FIG. 1. The electronic apparatus has a structure in which the semiconductor device illustrated in FIG. 1 is mounted on a mount substrate 600. On a surface that is opposite to the first surface of the interconnect substrate 200, soldering balls 620 are installed as external connection terminals. The semiconductor device is fixed to the mount substrate 600 through the soldering balls 620. The mount substrate 600 is, for example, a printed substrate.

Next, the operation and effect of this embodiment will be described. In this embodiment, the first inductor 112 and the second inductor 122 are mounted on the same semiconductor chip 100. Accordingly, the manufacturing cost of the semiconductor device can be lowered.

On the boundary surface between the sealing resin 400 and the multilayer interconnect layer 106 (that is, the surface of the multilayer interconnect layer 106), the groove 500 is formed. The groove 500 is formed on the whole area of at least a portion that is positioned between the first inductor 112 and the second inductor 122. This results, even if a metal material that forms the first inductor 112 and the second inductor 122 causes migration through a peeling portion occurred on the boundary surface between the sealing resin 400 and the multilayer interconnect layer 106, the movement distance for the metal material that is required for electrically connecting the first inductor 112 to the second inductor 122 increases, in comparison to a case where the groove 500 is not formed. This allows preventing the insulation between the first inductor 112 and the second inductor 122 from being unable to be secured due to the migration of the metal material that forms the first inductor 112 and the second inductor 122.

The first inductor 112 and the second inductor 122 are formed on the same interconnect layer. This allows preventing deviating the center of the winding axis of the first inductor 112 from that of the second inductor 122 in comparison to the case where the first inductor 112 and the second inductor 122 are formed on the respective different semiconductor chips. Accordingly, the first inductor 112 and the second inductor 122 have a high signal transfer efficiency between them. Further, the groove 500 is formed after the semiconductor chip 100, in which the first inductor 112 and the second inductor 122 are formed on the same layer, is mounted on the interconnect substrate 200. This allows preventing deviating the center of the winding axis of the first inductor 112 from that of the second inductor 122 regardless of the existence/nonexistence of the variation of the thickness of a layer that fixes the semiconductor chip 100 to the interconnect substrate 200 such as Ag paste and the variation of the thickness of the chip. Accordingly, the first inductor 112 and the second inductor 122 have a high signal transfer efficiency between them.

A interconnect is formed neither between the first inductor 112 and the groove 500 nor between the second inductor 122 and the groove 500. This allows improving a signal transfer efficiency between the first inductor 112 and the second inductor 122 in comparison to a case where a interconnect is formed between them.

The groove 500 may be formed using the dicing blade 510 in order to reduce the cost for forming the groove 500.

Figure 8:
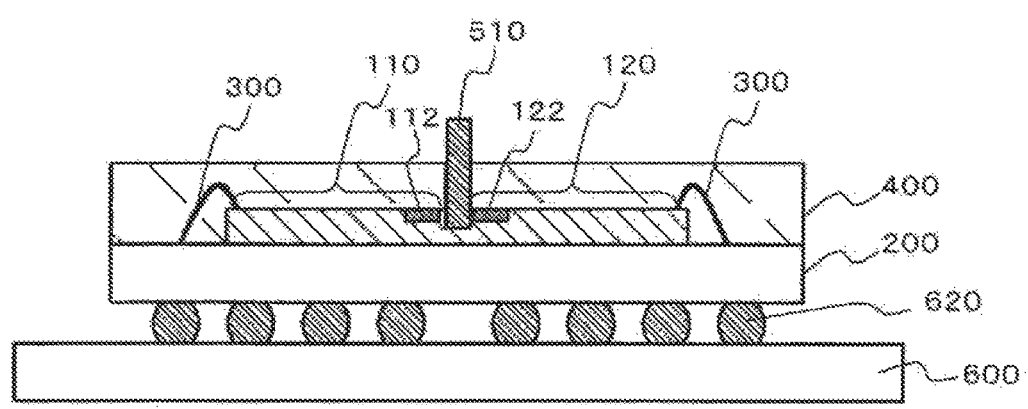
FIG. 8 is a cross-sectional view illustrating a modified example of the first embodiment.

In this embodiment, the groove 500 may have a two-stage structure including a first groove and a second groove having a narrower width than the first groove and formed on the bottom surface of the first groove. The groove between the inductors may be formed as the second groove having the narrow width in order to reduce the distance between the inductors. The groove 500 or at least one of the first and second grooves may be formed by laser. As illustrated in FIG. 8, timing for forming the groove 500 may be after mounting the semiconductor device on the mount substrate 600.

The timing for forming the groove 500 may be before resin sealing. Since the semiconductor chip 100 is mounted on (fixed to) the interconnect substrate 200, it is possible, even if the timing for forming the groove 500 is before the resin sealing, to maintain the accuracy of the relative positions between the first inductor 112 and the second inductor 122 in a state where the both inductors are formed in the semiconductor chip 100, unless the interconnect substrate 200 is completely separated by the groove 500. Before the resin sealing, for example, the position for forming the groove 500 can be determined based on a pattern formed on the external shape of the semiconductor chip 100 or on the surface of the semiconductor chip 100. Thus, the groove 500 can be formed at high accuracy. In these cases, the sealing resin 400 may be filled in the groove 500.

If the groove 500 is formed so that the substrate 102 of the semiconductor chip 100 is not completely separate by the groove 500, the groove 500 may be formed before the semiconductor chip 100 is mounted on the interconnect substrate 200. In this case, it may be considered that the groove 500 is formed in the dicing from the wafer that cuts and carries off respective semiconductor chips 100 including both the first inductor 112 and the second inductor 122.

(Second Embodiment)

Figure 9:
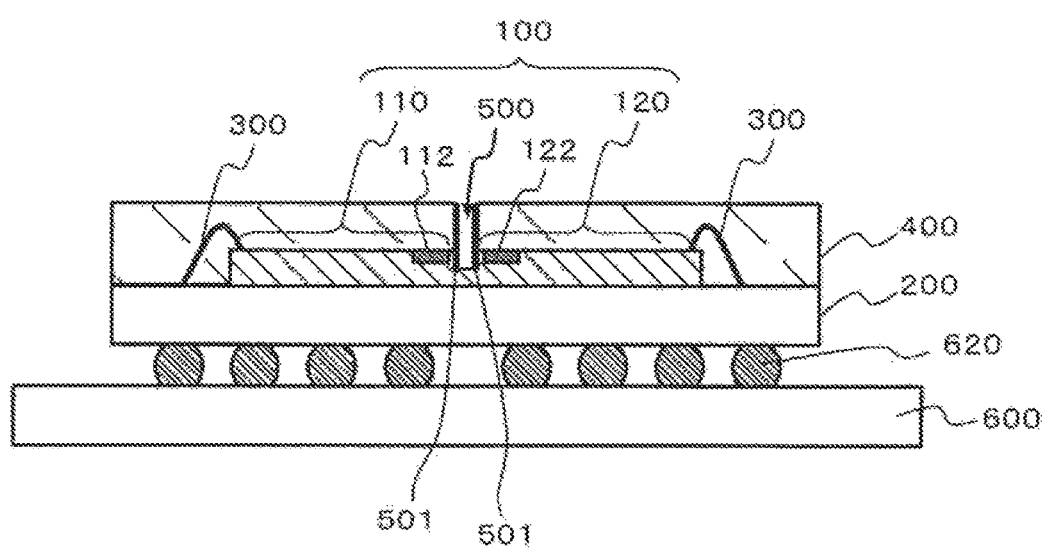
FIG. 9 is a cross-sectional view illustrating the configuration of an electronic apparatus according to a second embodiment.

FIG. 9 is a cross-sectional view illustrating the configuration of an electronic apparatus according to a second embodiment, and corresponds to FIG. 7 in the first embodiment. The electronic apparatus according to this embodiment has the same configuration as the electronic apparatus according to the first embodiment except for the point that a sealing layer 501 is formed on a side surface of the groove 500.

The sealing layer 501, for example, may be made of resin such as epoxy, polyimide, silicon, acrylic resin, or urethane, and suppresses penetration of moisture or the like into the inside of the semiconductor chip 100 from the side surface of the groove 500.

Even in this embodiment, the same effect as the first embodiment can be obtained. Further, since the sealing layer 501 is formed on the side surface of the groove 500, the electronic apparatus can prevent its durability from deteriorating from the side surface of the groove 500. In this case, the sealing layer 501 may be formed in respective embodiments to be described later.

(Third Embodiment)

Figure 10:
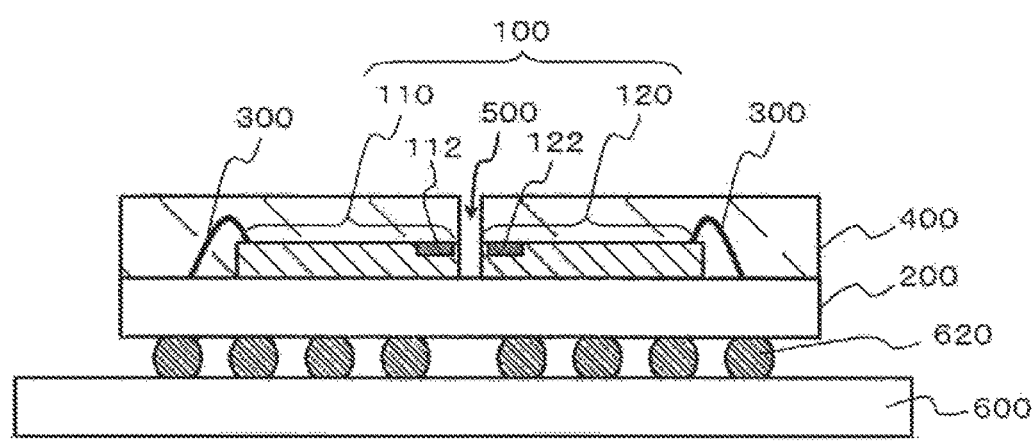
FIG. 10 is a cross-sectional view illustrating the configuration of an electronic apparatus according to a third embodiment.

FIG. 10 is a cross-sectional view illustrating the configuration of an electronic apparatus according to a third embodiment, and corresponds to FIG. 7 in the first embodiment. The electronic apparatus according to this embodiment has the same configuration as the electronic apparatus according to the first embodiment except for the point that the groove 500 penetrates the semiconductor chip 100. The bottom surface of the groove 500 may enter into the interconnect substrate 200.

Even in this embodiment, the same effect as the first embodiment can be obtained. Further, since the groove 500 penetrates the semiconductor chip 100, the groove 500 can surely penetrate the boundary surface between the multilayer interconnect layer 106 and the sealing resin 400 even if manufacturing tolerance occurs. Since the first circuit area 110 and the second circuit area 120 of the semiconductor chip 100 are separated as well as the substrate 102 from each other, much higher insulation withstanding voltage can be obtained. Also, the first circuit area 110 and the second circuit area 120 can prevent noise from propagating from one side to the other side through the substrate 102.

(Fourth Embodiment)

Figure 11:
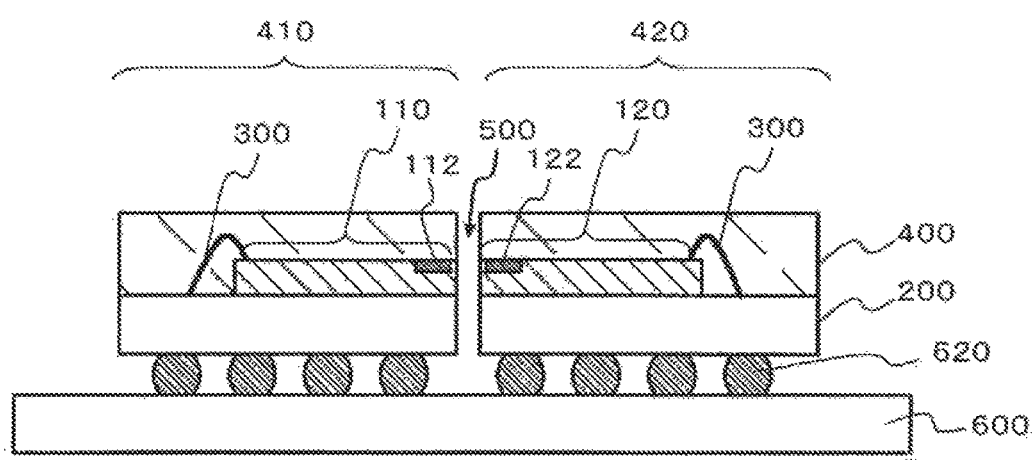
FIG. 11 is a cross-sectional view illustrating the configuration of an electronic apparatus according to a fourth embodiment.

FIG. 11 is a cross-sectional view illustrating the configuration of an electronic apparatus according to a fourth embodiment, and corresponds to FIG. 7 in the first embodiment. The electronic apparatus according to this embodiment has the same configuration as the electronic apparatus according to the first embodiment except for the point that the groove 500 penetrates the semiconductor chip 100 and the interconnect substrate 200 and thus the semiconductor device is divided into two semiconductor devices 410 and 420. The semiconductor device 410 and the semiconductor device 420, which are formed by dividing one semiconductor device, form a pair, and before they are mounted on the mount substrate 600, they are managed as one set of semiconductor devices. The semiconductor devices 410 and 420 have a flat upper surface of the sealing resin 400. The distance from the upper surface of the sealing resin 400 to the winding axis of the first inductor 112 in the semiconductor device 410 is equal to the distance from the upper surface of the sealing resin 400 to the winding axis of the second inductor 122 in the semiconductor device 420.

Figure 12A:
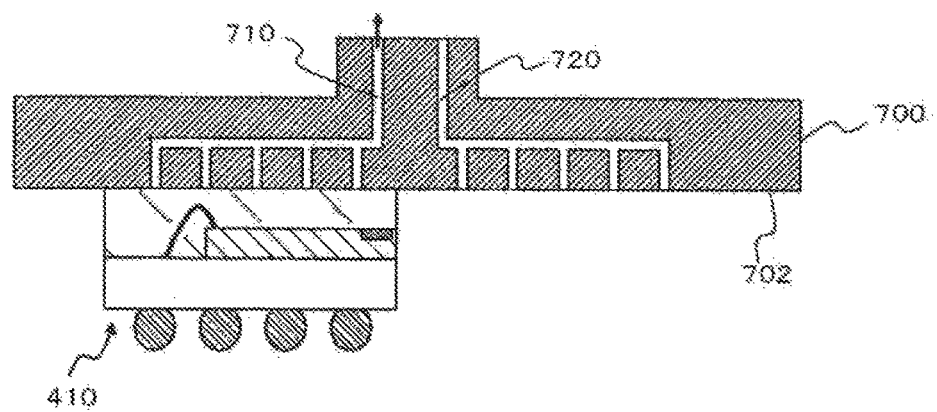
FIGS. 12A and 12B are cross-sectional views illustrating an example of a method of mounting a semiconductor device on a mount substrate.
Figure 12B:
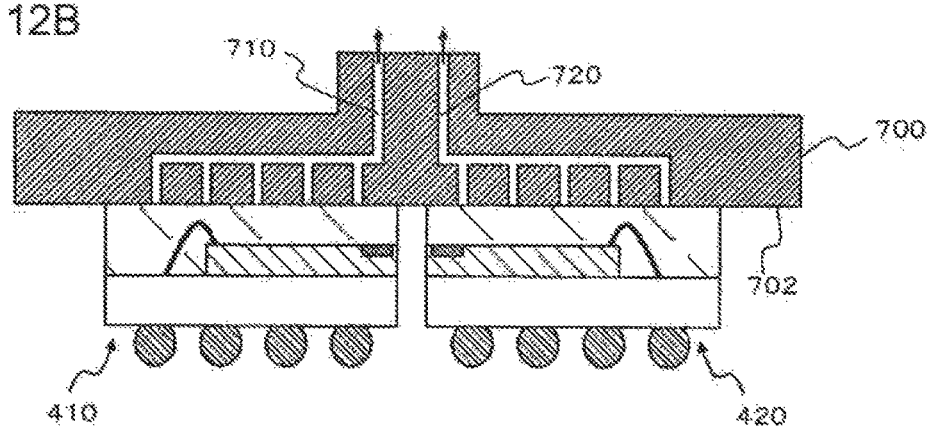
Figure 13:
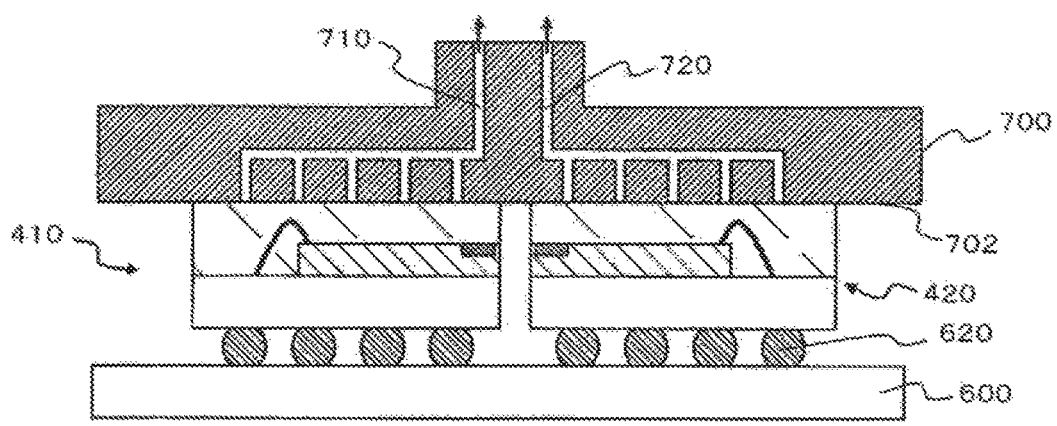
FIG. 13 is a cross-sectional view illustrating an example of a method of mounting a semiconductor device on a mount substrate.

FIGS. 12A and 12B and 13 are cross-sectional views illustrating an example of a method of mounting the semiconductor devices 410 and 420 on the mount substrate 600.

First, as illustrated in FIG. 12A, an adsorption device 700 is prepared. The adsorption surface 702 of the adsorption device 700 is flat. In the adsorption device 700, adsorption nozzles 710 and 720 are installed. The adsorption nozzles 710 and 720 are open on the adsorption surface 702.

Then, using the adsorption nozzle 710, the adsorption surface 702 of the adsorption device 700 adsorbs the upper surface of the sealing resin 400 of the semiconductor device 410.

Then, as illustrated in FIG. 12B, using the adsorption nozzle 720, the adsorption surface 702 of the adsorption device 700 adsorbs the upper surface of the sealing resin 400 of the semiconductor device 420. As described above, the distance from the upper surface of the sealing resin 400 to the winding axis of the first inductor 112 in the semiconductor device 410 is equal to the distance from the upper surface of the sealing resin 400 to the winding axis of the second inductor 122 in the semiconductor device 420. The adsorption surface 702 of the adsorption device 700 is flat. Thus, in a state as illustrated in FIG. 12B, the first inductor 112 faces the second inductor 122.

Then, as illustrated in FIG. 13, by moving the adsorption device 700, the semiconductor devices 410 and 420 are arranged on the mount substrate 600. Then, by heating soldering balls 620 and then cooling the soldering balls 620, the semiconductor devices 410 and 420 are mounted on the mount substrate 600. Thereafter, the semiconductor devices 410 and 420 are open from the adsorption device 700. At this time, if the adsorption device 700 has a heating mechanism and a cooling mechanism, the heating and cooling of the soldering balls 620 are performed by the adsorption device 700.

Even in this embodiment, the same effect as the first embodiment can be obtained. Further, one set of the semiconductor devices 410 and 420, which form a pair, is formed by dividing one semiconductor device. This allows reducing the manufacturing cost of the semiconductor devices 410 and 420.

The semiconductor devices 410 and 420 are formed by dividing one semiconductor device 400, and the first inductor 112 and the second inductor 122 are formed on the same layer. Thus, the distance from the upper surface of the sealing resin 400 to the winding axis of the first inductor 112 in the semiconductor device 410 is equal to the distance from the upper surface of the sealing resin 400 to the winding axis of the second inductor 122 in the semiconductor device 420. Since, in this embodiment, the flat surface that is a reference such as the adsorption surface 702 of the adsorption device 700 is made to adsorb the upper surface of the sealing resin 400 of the semiconductor device 410 and the upper surface of the sealing resin 400 of the semiconductor device 420, the first inductor 112 can easily face the second inductor 122. Thus, efforts required when determining the relative positions of the semiconductor devices 410 and 420 can be reduced in mounting the semiconductor devices 410 and 420 on the mount substrate 600. Further, one semiconductor device 400 may be separated into two semiconductor devices 410 and 420 after the semiconductor device 400 is mounted on the mount substrate 600. In this embodiment, since even the interconnect substrate 200 is separated between the semiconductor device 410 and the semiconductor device 420, the interconnect substrate 200 can improve its internal insulation reliability.

(Fifth Embodiment)

Figure 14A:
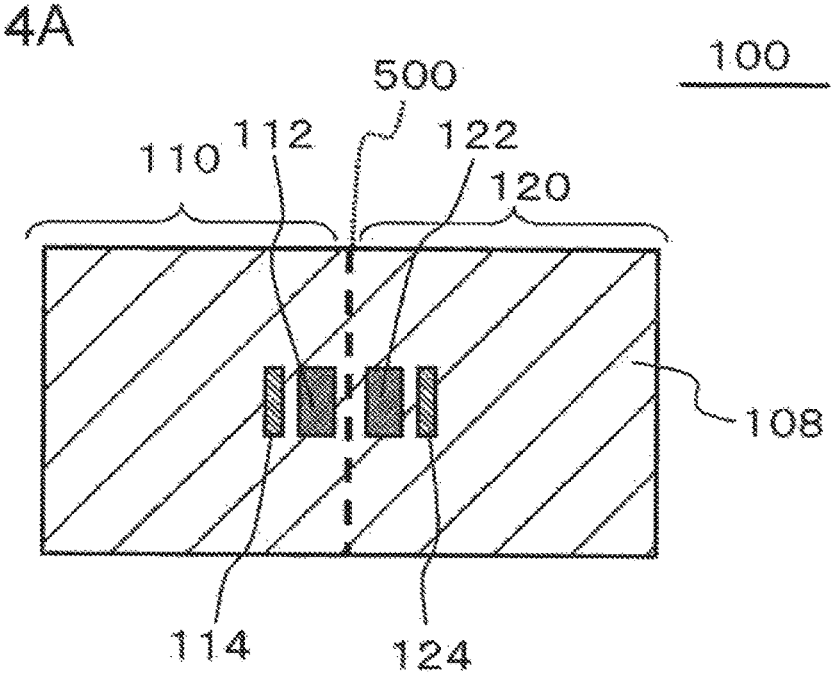
FIGS. 14A and 14B are schematic plan views of a semiconductor device according to a fifth embodiment.
Figure 14B:
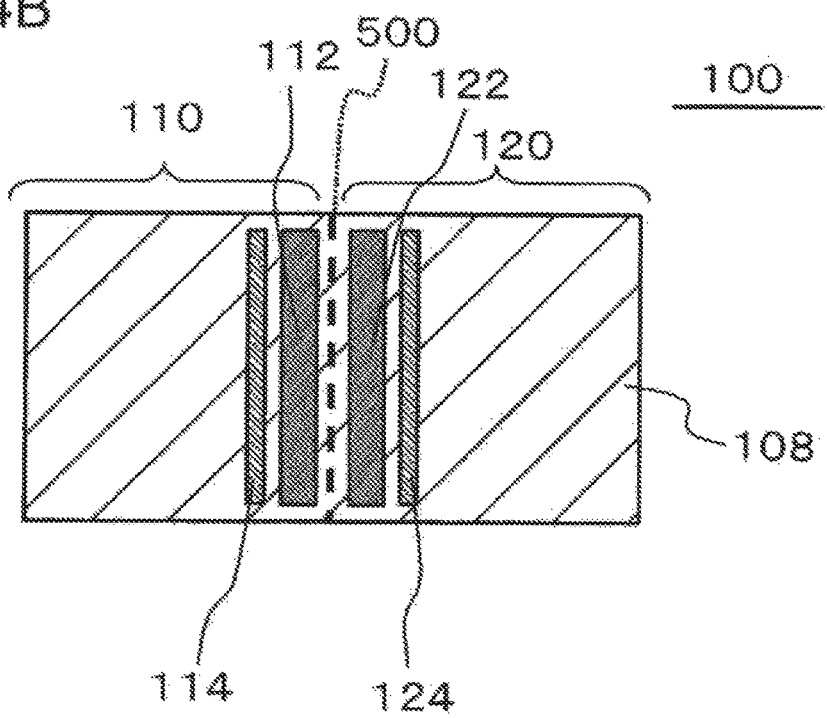

FIGS. 14A and 14B are schematic plan views of a semiconductor device according to a fifth embodiment, and correspond to FIGS. 4A and 4B according to the first embodiment. The semiconductor device according to this embodiment has the same configuration as the semiconductor device according to the first embodiment except for the point that magnetic shielding layers 114 and 124 are provided. The magnetic shielding layers 114 and 124, for example, are formed by laminating a conductor layer that forms the interconnect layer, and their length is longer than the length of the first and second inductors 112 and 122. The magnetic shielding layer 114 is formed in such a position as to shield the first inductor 112 from other circuits of the first circuit area 110, and the magnetic shielding layer 124 is formed in such a position as to shield the second inductor 122 from other circuits of the second circuit area 120. To the magnetic shielding layers 114 and 124, a constant electric potential, for example, a ground potential or a power supply potential, is given.

Even in this embodiment, the same effect as the first embodiment can be obtained. Further, the magnetic shielding layers 114 and 124 prevent the magnetic fields generated from the first inductor 112 and the second inductor 122 exerting an influence on the operation of other circuits of the first circuit area 110 and the second circuit area 120.

(Sixth Embodiment)

Figure 15A:
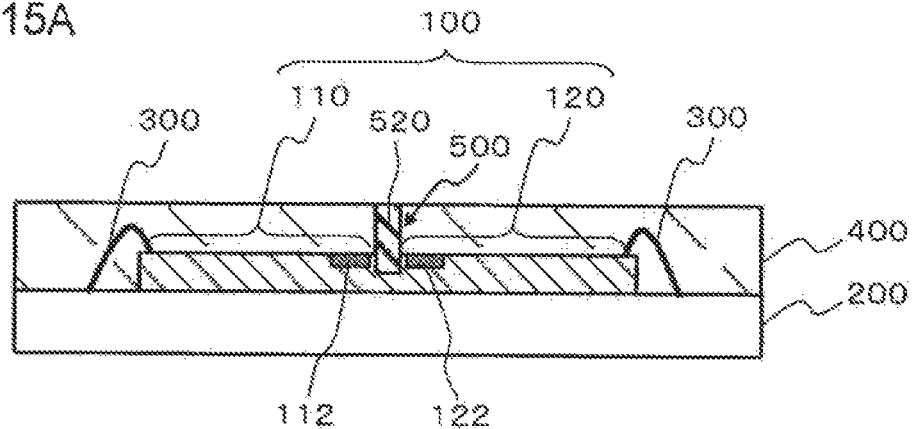
FIGS. 15A and 15B are schematic cross-sectional views of a semiconductor device according to a sixth embodiment.
Figure 15B:
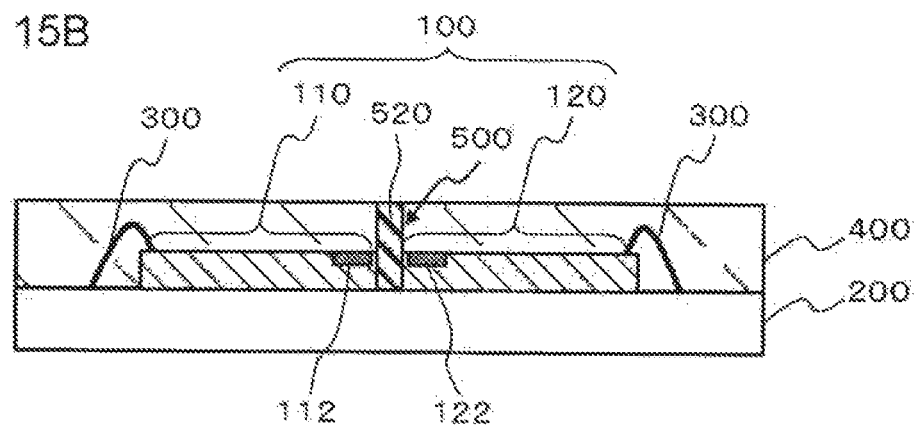

FIGS. 15A and 15B are schematic cross-sectional views of a semiconductor device according to a sixth embodiment. The semiconductor device according to this embodiment has the same configuration as the semiconductor device according to the first embodiment or the third embodiment except for the point that the resin layer 520 is filled in the groove 500. The resin layer 520, for example, may be made of resin such as epoxy, polyimide, silicon, or urethane. However, in the case where the resin layer 520 is made of epoxy, it is preferable that the resin layer 520 has a lower content rate of the filler than the sealing resin 400. Here, the content rate of the filler, for example, is defined by an area that is occupied by the filler on the cross-section. By using the semiconductor device, as illustrated in FIGS. 16A and 16B, the same electronic apparatus as the first embodiment can be formed.

Even in this embodiment, the same effect as the first embodiment can be obtained. Further, the resin layer 520 thus filled in the groove 500 can prevent the durability (for example, moisture resistance) of the semiconductor device from deteriorating due to the forming of the groove 500. In the case where the resin layer 520 is made of epoxy resin and the resin layer 520 has a lower content rate of the filler than the sealing resin 400, void occurrence can be suppressed even if the width of the groove 500 is narrow (for example, equal to or less than 30 μm). This allows preventing the boundary surface of the multilayer interconnect layer 106 in the first circuit area 110 from connecting, through the void inside the resin layer 520, to the boundary surface of the multilayer interconnect layer 106 in the second circuit area 120. Thus, the semiconductor device can prevent its durability (for example, moisture resistance) from deteriorating.

(Seventh Embodiment)

Figure 17A:
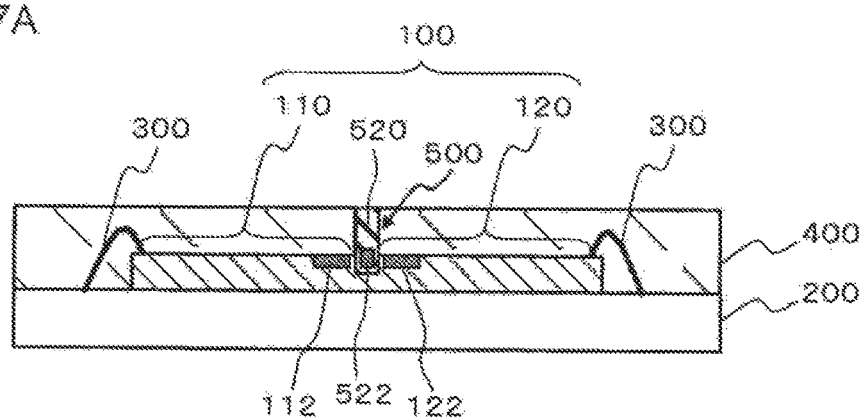
FIGS. 17A and 17B are schematic cross-sectional views of a semiconductor device according to a seventh embodiment.
Figure 17B:
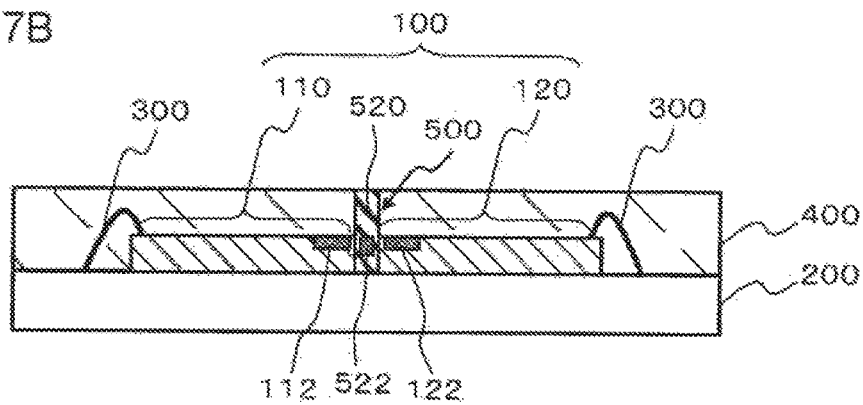
Figure 18A:
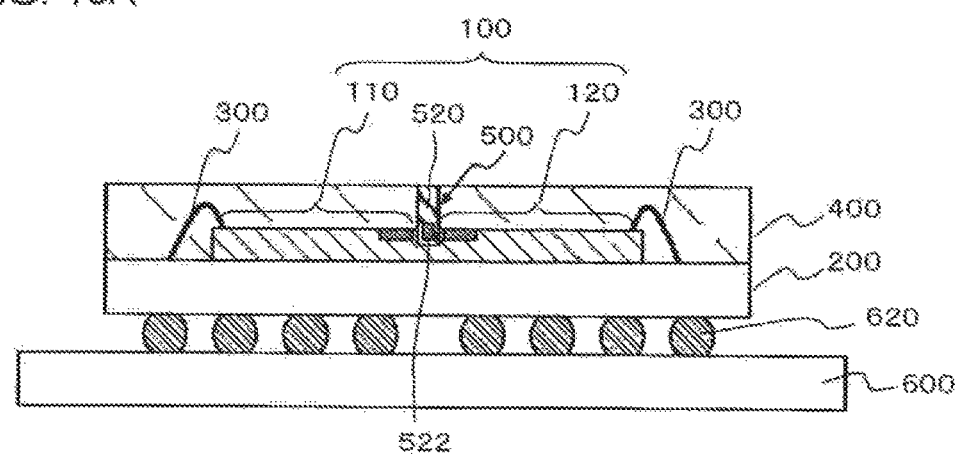
FIGS. 18A and 18B are schematic cross-sectional views of an electronic apparatus according to a seventh embodiment.
Figure 18B:
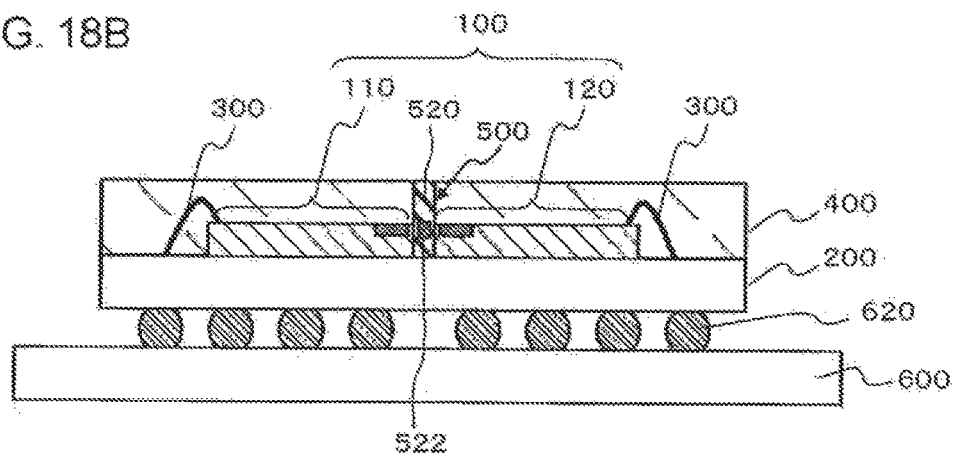

FIGS. 17A and 17B are schematic cross-sectional views of a semiconductor device according to a seventh embodiment. The semiconductor device according to this embodiment has the same configuration as the semiconductor device according to the sixth embodiment except for the point that a magnetic permeable member 522 is installed inside the resin layer 520. The magnetic permeable member 522, for example, is formed of a material having high magnetic permeability, such as iron, and is arranged on a straight line that connects the winding axes of the first inductor 112 and the second inductor 122. By using the semiconductor devices, as illustrated in FIGS. 18A and 18B, the same electronic apparatus as the first embodiment can be formed.

Even in this embodiment, the same effect as the sixth embodiment can be obtained. Further, since the magnetic permeable member 522 is arranged between the first inductor 112 and the second inductor 122, the first inductor 112 and the second inductor 122 can obtain a high coupling coefficient between them.

(Eighth Embodiment)

Figure 19A:
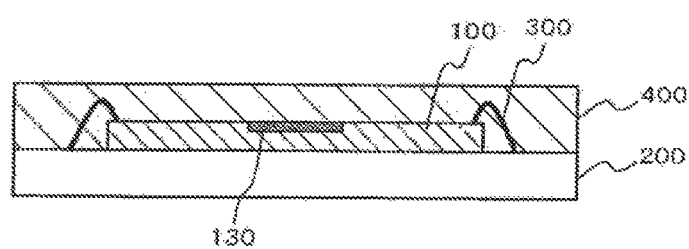
FIGS. 19A and 19B are cross-sectional views illustrating a method of manufacturing a semiconductor device according to an eighth embodiment.
Figure 19B:
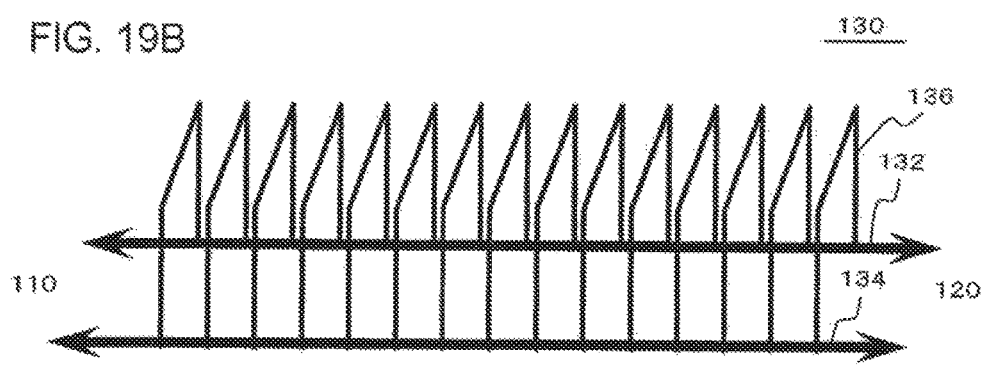

FIGS. 19A and 19B and 20A and 20B are cross-sectional views illustrating a method of manufacturing a semiconductor device according to an eighth embodiment. First, as illustrated in FIG. 19A, the semiconductor chip 100 is mounted on the interconnect substrate 200. On the semiconductor chip 100 an inductor 130 is formed rather than the first inductor 112 and the second inductor 122. The inductor 130, as illustrated in FIG. 19B, is provided with two interconnects 132 and 134 and a plurality of interconnects 136 of a loop type which are connected to the interconnects 132 and 134. The plurality of interconnects 136 are formed in parallel with each other, and one end of each interconnect is connected to the interconnect 132, while the other end thereof is connected to the interconnect 134. One end of the two interconnects 132 and 134 is connected to an oscillation circuit installed in the first circuit area 110, while the other end thereof is connected to a reception circuit installed in the second circuit area 120.

Then, the bonding wire 300 and the sealing resin 400 are formed. The method of forming them is the same as that according to the first embodiment.

Figure 20A:
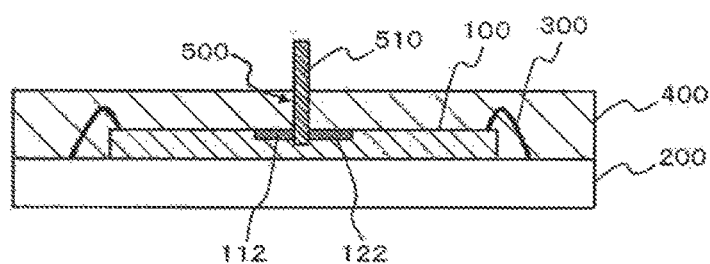
FIGS. 20A and 20B are cross-sectional views illustrating a method of manufacturing a semiconductor device according to an eighth embodiment.
Figure 20B:
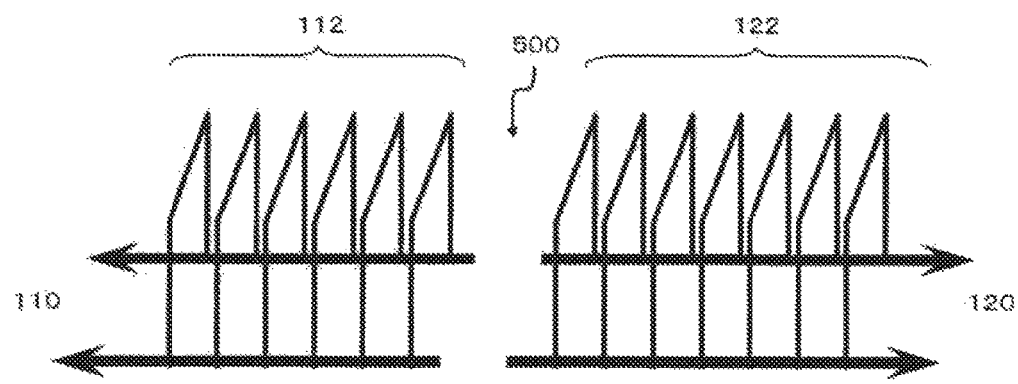

Then, as illustrated in FIG. 20A, the groove 500 is formed using the dicing blade 510. The groove 500 penetrates the interconnect layer in which the inductor 130 is formed. Thus, the inductor 130 is divided into the first inductor 112 and the second inductor 122 through the groove 500.

The subsequent process is equal to that according to the first embodiment.

Even in this embodiment, the same effect as the first embodiment can be obtained. Further, if an error occurs in the position for forming the groove 500 through the dicing blade 510 in the case where the first inductor 112 and the second inductor 122 are pre-formed as in the first embodiment, the position for forming the groove 500 overlaps the first inductor 112 or the second inductor 122, and there is some possibility that the first inductor 112 or the second inductor 122 is removed. According to this embodiment, by dividing the inductor 130 through the dicing blade 510, the first inductor 112 and the second inductor 122 are formed. Thus, the first inductor 112 and the second inductor 122 can remain surely.

(Ninth Embodiment)

Figure 21A:
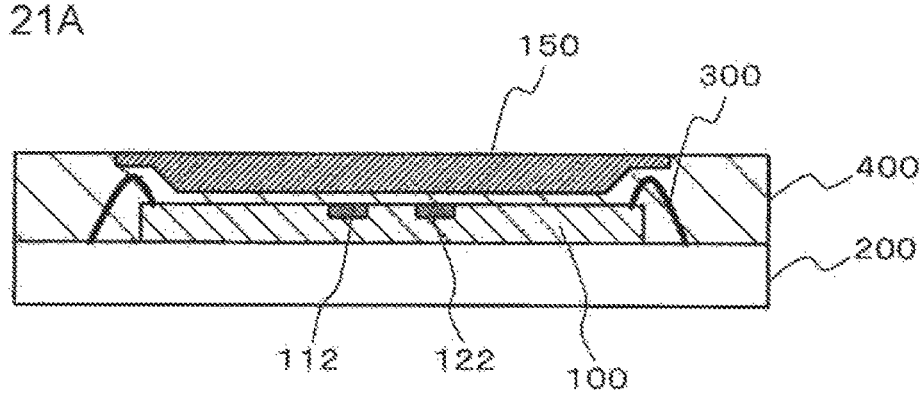
FIGS. 21A and 21B are cross-sectional views illustrating a method of manufacturing a semiconductor device according to a ninth embodiment.
Figure 21B:
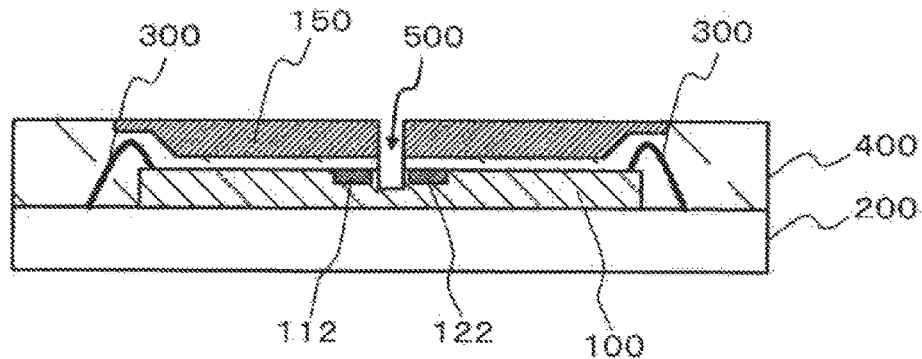
Figure 22:
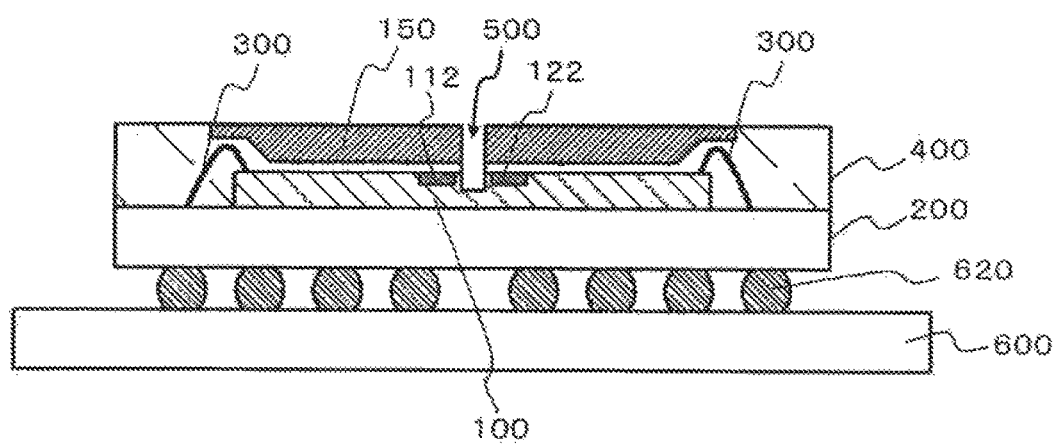
FIG. 22 is a cross-sectional view illustrating a method of manufacturing a semiconductor device according to a ninth embodiment.

FIGS. 21A and 21B and 22 are cross-sectional views illustrating a method of manufacturing a semiconductor device according to a ninth embodiment. First, as illustrated in FIG. 21A, the semiconductor chip 100 is mounted on the interconnect substrate 200. At this time, the active surface of the semiconductor chip 100 is directed opposite to the interconnect substrate 200. Then, the semiconductor chip 100 and the interconnect substrate 200 are connected together using the bonding wire 300. Then, the first surface of the interconnect substrate 200, the bonding wire 300, and the semiconductor chip 100 are sealed using the sealing resin 400. At this time, a heat sink 150 is buried in the sealing resin 400. The heat sink 150, as seen from the plane, overlaps the semiconductor chip 100, and one surface thereof is exposed from the upper surface of the sealing resin 400. The one surface of the heat sink 150 and the upper surface of the sealing resin 400 form the same plane.

Then, as illustrated in FIG. 21B, the groove 500 is formed from the upper surface of the heat sink 150 toward the multilayer interconnect layer 106 using the dicing blade 510.

That is, in this embodiment, the groove 500 penetrates the heat sink 150 and the sealing resin 400.

Then, using the semiconductor device on which the groove 500 is formed, as illustrated in FIG. 22, the same electronic apparatus as the first embodiment can be formed.

Figure 23A:
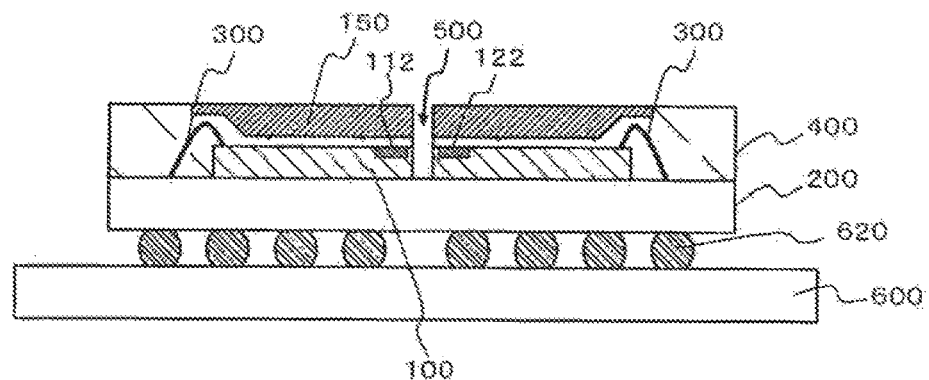
FIGS. 23A and 23B are cross-sectional views illustrating a modified example of a ninth embodiment.
Figure 23B:
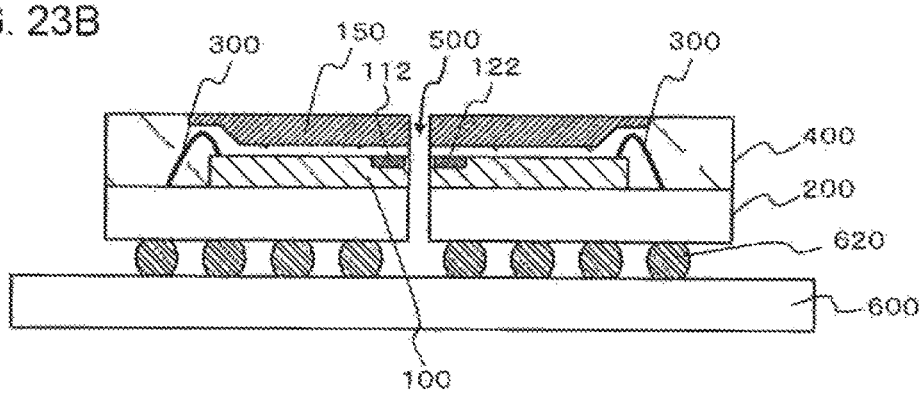

In this case, as illustrated in the respective drawings 23A and 23B, the groove 500 may penetrate the semiconductor chip 100 (FIG. 23A), or may penetrate the semiconductor chip 100 and the interconnect substrate 200 (FIG. 23B). The resin layer may be filled in the groove 500 including a portion that is positioned on the same layer as the heat sink 150.

Even in this embodiment, the same effect as the first embodiment can be obtained.

(Tenth Embodiment)

Figure 24:
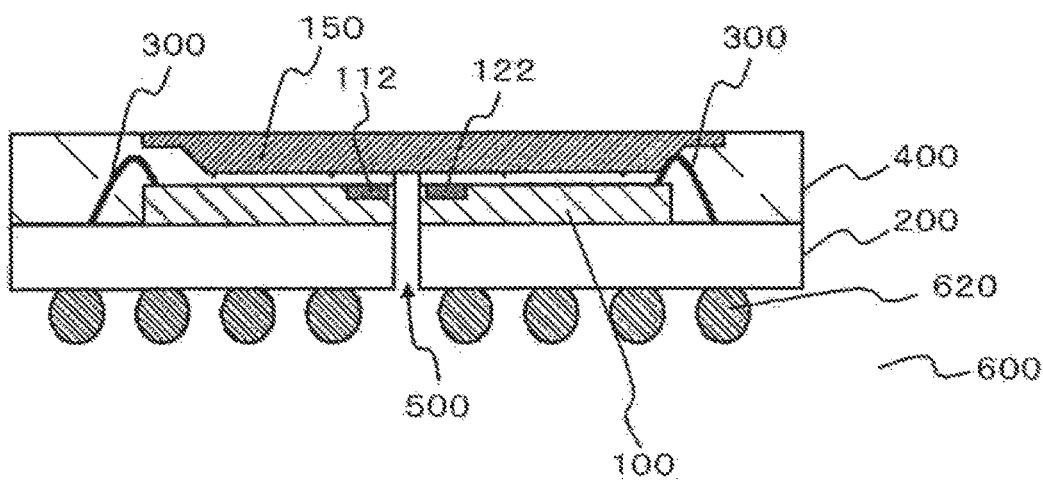
FIG. 24 is a cross-sectional view illustrating the configuration of a semiconductor device according to a tenth embodiment.

FIG. 24 is a cross-sectional view illustrating the configuration of a semiconductor device according to a tenth embodiment. The semiconductor device according to this embodiment has the same configuration as the semiconductor device according to the ninth embodiment except for the position of the groove 500.

In this embodiment, the groove 500 is formed from the bottom surface of the interconnect substrate 200 and penetrates the interconnect substrate 200 and the semiconductor chip 100 using the dicing blade 510. However, the groove 500 does not penetrate the heat sink 150.

Even in this embodiment, the same effect as the first embodiment can be obtained. Further, although the semiconductor device is divided into two semiconductor devices except for the heat sink 150, the two divided semiconductor devices are bonded into one body in the heat sink 150. Thus, when mounting the semiconductor device on the mount substrate 600, the position alignment in the height direction of the two semiconductor devices becomes unnecessary, thus suppressing the increase of efforts when mounting the semiconductor device.

(Eleventh Embodiment)

Figure 25:
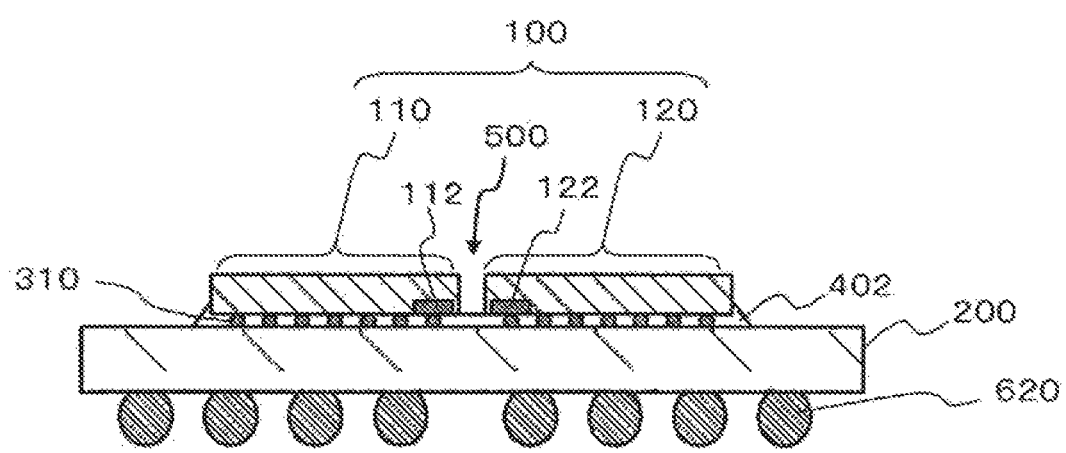
FIG. 25 is a cross-sectional view illustrating the configuration of a semiconductor device according to an eleventh embodiment.

FIG. 25 is a cross-sectional view illustrating the configuration of a semiconductor device according to an eleventh embodiment. The semiconductor device according to this embodiment has the same configuration as the semiconductor device according to the first embodiment except for the following point.

First, the semiconductor chip 100 is flip-chip-mounted on the first surface of the interconnect substrate 200. A space between the active surface of the semiconductor chip 100 and the first surface of the interconnect substrate 200 is sealed by the sealing resin (under-fill resin) 402. Further, the groove 500 is formed from the rear surface side of the semiconductor chip 100 toward the sealing resin 402.

Figure 26A:
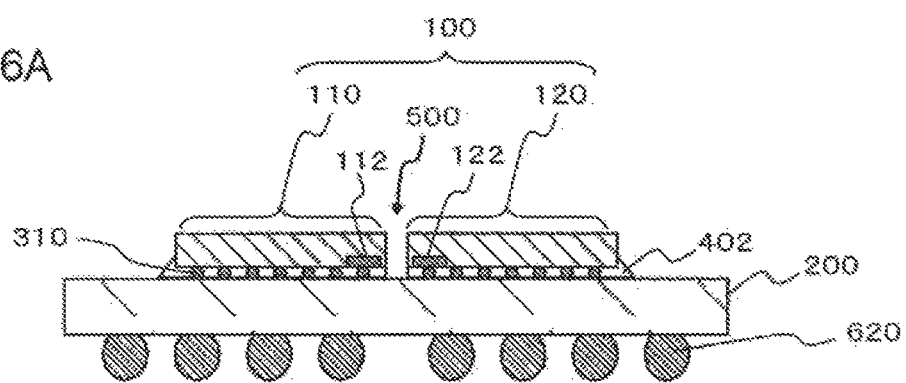
FIGS. 26A and 26B are cross-sectional views illustrating a modified example of a semiconductor device according to an eleventh embodiment.
Figure 26B:
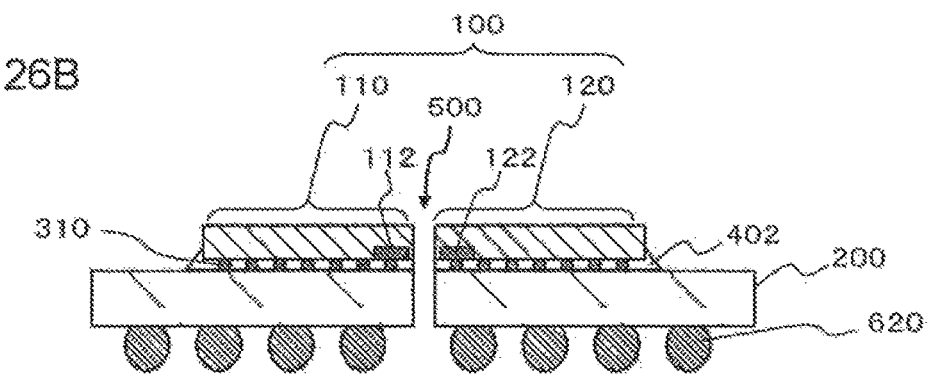

In an example illustrated in FIG. 25, the groove 500 penetrates the semiconductor chip 100, but does not penetrate the sealing resin 402. However, as illustrated in FIGS. 26A and 26B, the groove 500 may penetrate the semiconductor chip 100 and the sealing resin 402, or may penetrate the semiconductor chip 100, the sealing resin 402, and the interconnect substrate 200.

Even in this embodiment, the same effect as the first embodiment can be obtained.

(Twelfth Embodiment)

Figure 27:
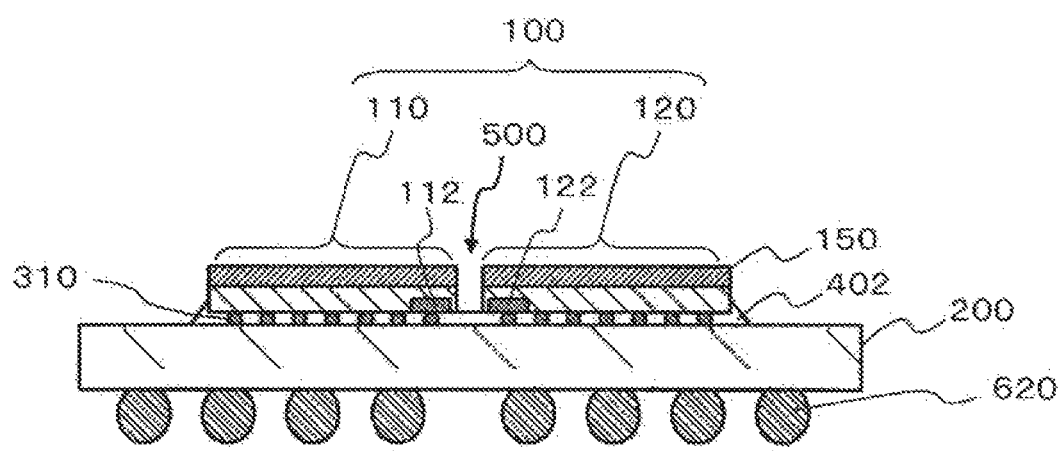
FIG. 27 is a cross-sectional view illustrating the configuration of a semiconductor device according to a twelfth embodiment.
Figure 28A:
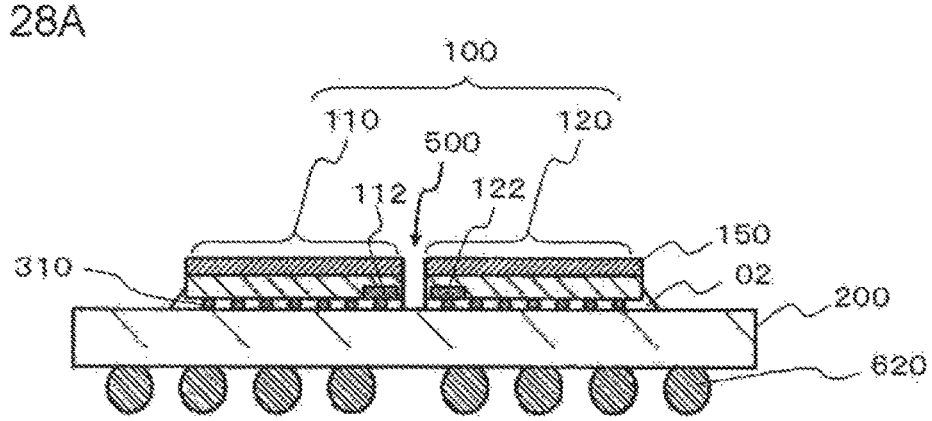
FIGS. 28A and 28B are cross-sectional views illustrating the configuration of a semiconductor device according to a twelfth embodiment.
Figure 28B:
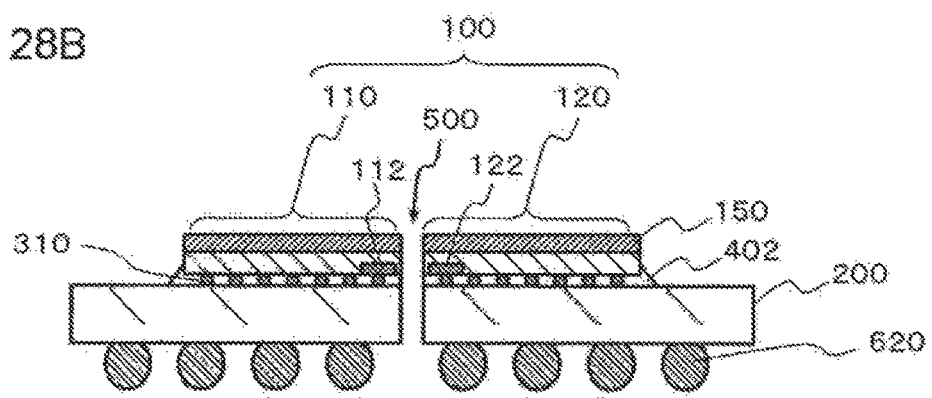

FIGS. 27 and 28A and 28B are cross-sectional views illustrating the configuration of a semiconductor device according to a twelfth embodiment. The semiconductor device according to this embodiment has the same configuration as the semiconductor device according to the eleventh embodiment except for the following point.

First, to the rear surface of the semiconductor chip 100, the heat sink 150 is attached. Further, the groove 500 penetrates at least the heat sink 150 and the semiconductor chip 100.

Even in this embodiment, the same effect as the eleventh embodiment can be obtained.

(Thirteenth Embodiment)

Figure 29:
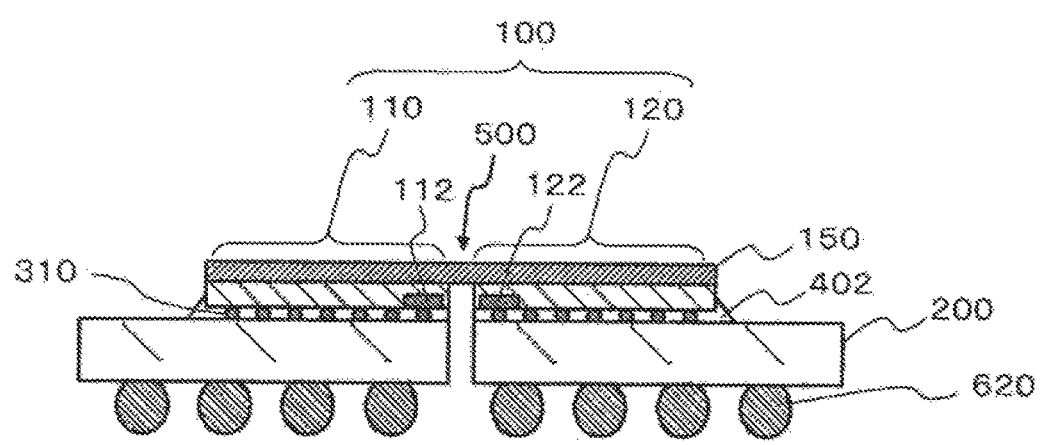
FIG. 29 is a cross-sectional view illustrating the configuration of a semiconductor device according to a thirteenth embodiment.

FIG. 29 is a cross-sectional view illustrating the configuration of a semiconductor device according to a thirteenth embodiment. The semiconductor device according to this embodiment has the same configuration as the semiconductor device according to the twelfth embodiment except for the position of the groove 500.

In this embodiment, the groove 500 is formed from the bottom surface of the interconnect substrate 200 and penetrates the interconnect substrate 200, the sealing resin 402, and the semiconductor chip 100 using the dicing blade 510. However, the groove 500 does not penetrate the heat sink 150.

Even in this embodiment, the same effect as the first embodiment can be obtained. Further, although the semiconductor device is divided into two semiconductor devices except for the heat sink 150, the two divided semiconductor devices are bonded into one body in the heat sink 150. Thus, when mounting the semiconductor device on the mount substrate 600, the position alignment in the height direction of the two semiconductor devices becomes unnecessary, thus suppressing the increase of efforts when mounting the semiconductor device.

(Fourteenth Embodiment)

Figure 30A:
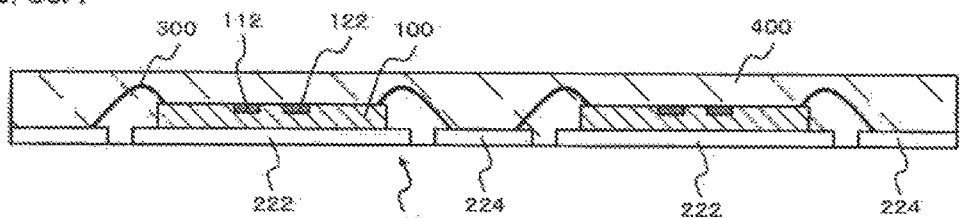
FIGS. 30A to 30C are cross-sectional views illustrating a method of manufacturing a semiconductor device according to a fourteenth embodiment.
Figure 30B:
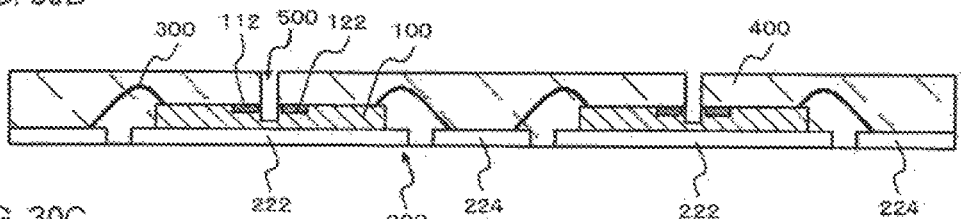
Figure 30C:
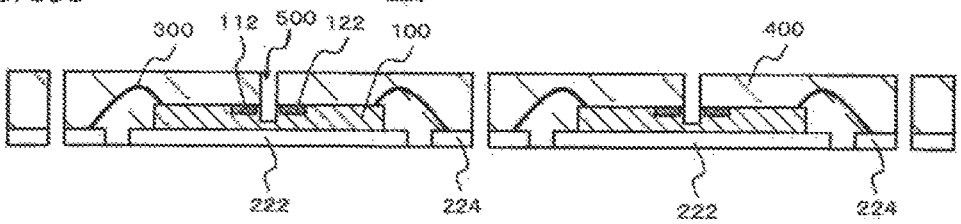

FIGS. 30A to 30C are cross-sectional views illustrating a method of manufacturing a semiconductor device according to a fourteenth embodiment. In this embodiment, the semiconductor chip 100 is mounted on a lead frame 220.

First, as illustrated in FIG. 30A, the semiconductor chip 100 is mounted on a die pad 222 of the lead frame 220, and the semiconductor chip 100 and a lead 224 of the lead frame 220 are connected together using the bonding wire 300.

Then, the lead frame 220 and the semiconductor chip 100 are sealed using the sealing resin 400. In this process, the upper surface of the sealing resin 400 is formed flat.

Then, as illustrated in FIG. 30B, the groove 500 is formed from the upper surface of the sealing resin 400 toward the semiconductor chip 100 using the dicing blade 510. In this embodiment, the groove 500 does not penetrate the semiconductor chip 100.

Then, as illustrated in FIG. 30C, the sealing resin 400 and the lead frame 220 are separated into individual semiconductor chips 100 using the dicing blade 510. In this case, the process as illustrated in FIG. 30B and the process as illustrated in FIG. 30C may be simultaneously performed. In this case, the forming of the groove 500 and the cutting for the division are alternately performed while the dicing blade 510 is moved in one direction from the right side to the left side in the drawing. Here, a dual dicer (a device having two or more dicing blades) may be used.

Even in this embodiment, the same effect as the first embodiment can be obtained. Further in an example illustrated in FIGS. 30A to 30C, a Quad Flat No-lead (QFN) type is exemplified as the lead frame 220. However, the lead frame 200 may be a Quad Flat Package (QFP) or a Small Outline Package (SOP). Further, the groove 500 may be formed after the semiconductor chip 100 is mounted on the die pad 222, and the semiconductor chip 100 may be sealed by the sealing resin 400 after the resin layer 520 is filled in the groove 500.

(Fifteenth Embodiment)

Figure 31A:
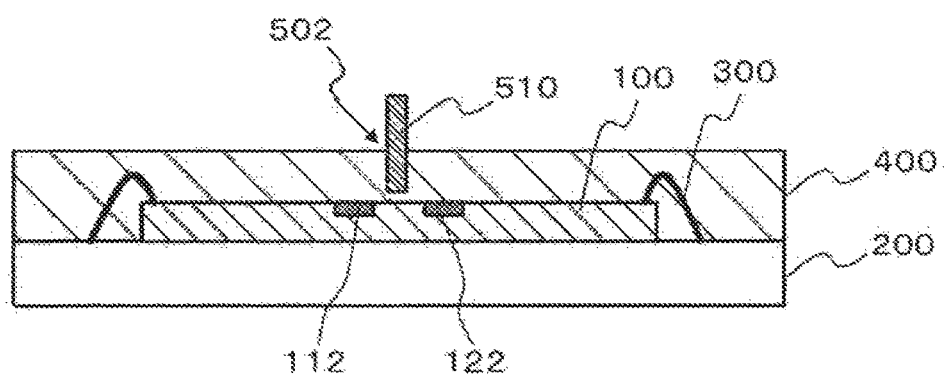
FIGS. 31A and 31B are cross-sectional views illustrating a method of manufacturing a semiconductor device according to a fifteenth embodiment.
Figure 31B:
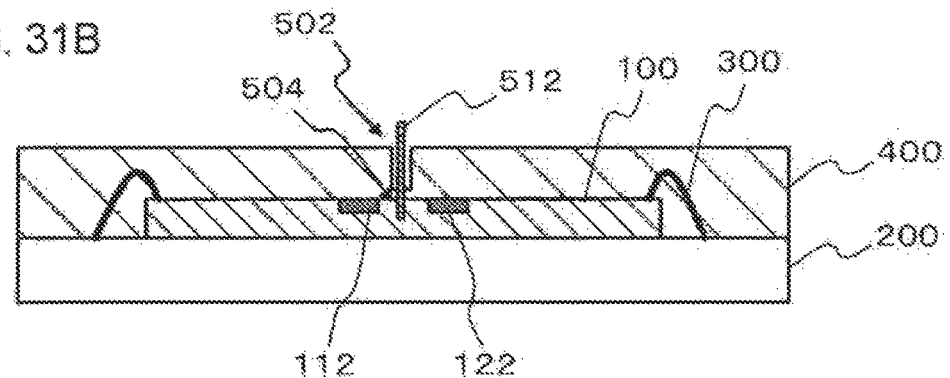
Figure 32:
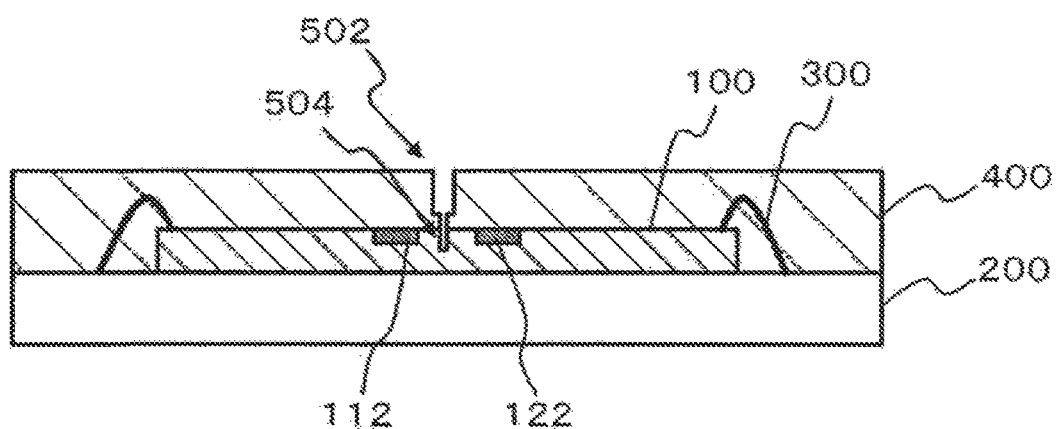
FIG. 32 is a cross-sectional view illustrating a method of manufacturing a semiconductor device according to a fifteenth embodiment.

FIGS. 31A and 31B and 32 are cross-sectional views illustrating a method of manufacturing a semiconductor device according to a fifteenth embodiment. The method of manufacturing the semiconductor device according to this embodiment is equal to the method of manufacturing the semiconductor device according to the first embodiment except for the point that a first groove 502 and a second groove 504 are formed instead of the groove 500.

First, as illustrated in FIG. 31A, the semiconductor chip 100 is mounted on the interconnect substrate 200. Then, the semiconductor chip 100 and the interconnect substrate 200 are connected together using the bonding wire 300. Then, the first surface of the interconnect substrate 200, the bonding wire 300, and the semiconductor chip 100 are sealed using the sealing resin 400.

Then, the first groove 502 is formed on a portion of the sealing resin 400 that is positioned between the first inductor 112 and the second inductor 122 using the dicing blade 510. In this case, the bottom surface of the first groove 502 is made not to reach the semiconductor chip 100.

Then, as illustrated in FIG. 31B, the second groove 504 is formed on the bottom portion of the first groove 502 using the dicing blade 512. The dicing blade 512 is thinner than the dicing blade 510. Here, the bottom portion of the second groove 504 is positioned below at least the layer of the semiconductor chip 100, in which the first inductor 112 and the second inductor 122 are formed.

Thus, the semiconductor as illustrated in FIG. 32 is formed. In this semiconductor device, the second groove 504 is formed between the first inductor 112 and the second inductor 122. The width of the second groove 504 is smaller than the width of the first groove 502.

At this time, the timing for forming the first groove 502 and the second groove 504, for example, is before the semiconductor device having the semiconductor chip 100, the interconnect substrate 200 and the sealing resin 400 is separated. That is, the above-described process is performed after a plurality of semiconductor chips 100 are mounted on the interconnect substrate 200 and the plurality of semiconductor chips 100 are collectively sealed by the sealing resin 400.

Even in this embodiment, the same effect as the first embodiment can be obtained. Further, the width of the second groove 504 positioned between the first inductor 112 and the second inductor 122 is narrow. This allows the first inductor 112 and the second inductor 122 to be close to each other, thus strengthening the bonding of the two inductors.

(Sixteenth Embodiment)

Figure 33A:
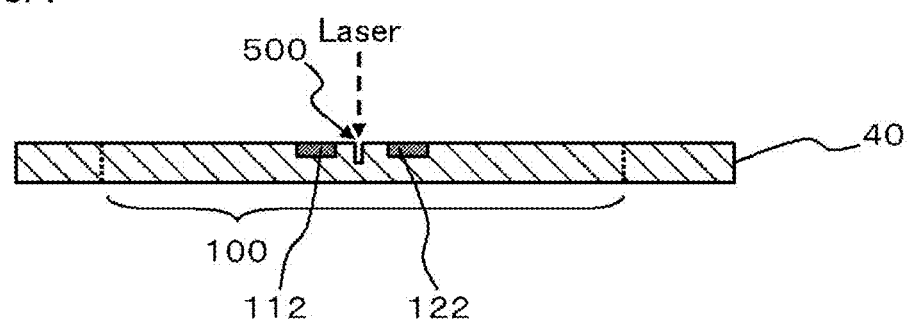
FIGS. 33A and 33B are cross-sectional views illustrating a method of manufacturing a semiconductor device according to a sixteenth embodiment.
Figure 33B:
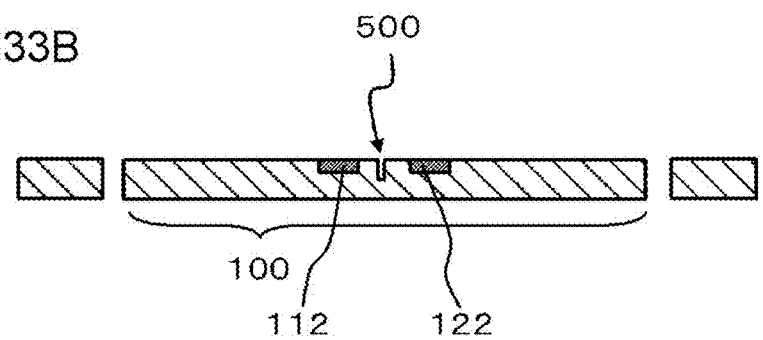
Figure 34:
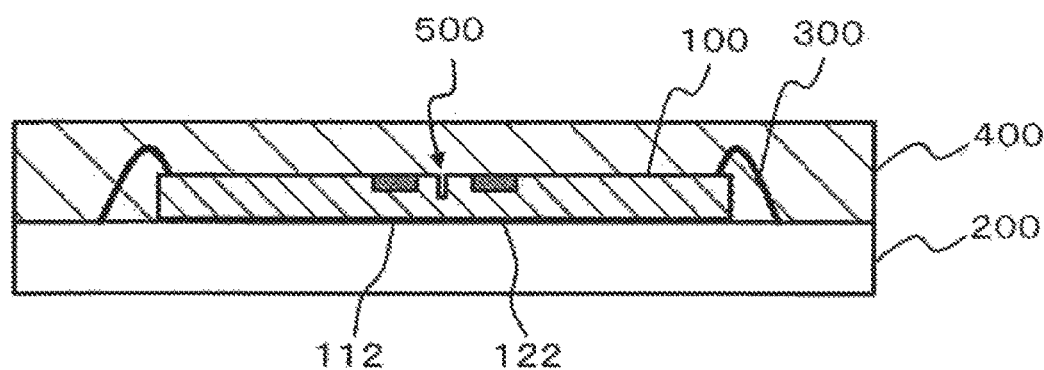
FIG. 34 is a cross-sectional view illustrating a method of manufacturing a semiconductor device according to a sixteenth embodiment.

In FIGS. 33A and 33B and 34, first, as illustrated in FIG. 33A, an element (not illustrated), the first inductor 112, and the second inductor 122 are formed on a semiconductor wafer 40. The semiconductor wafer 40 is separated into a plurality of semiconductor chips 100, and the element, the first inductor 112, and the second inductor 122 are installed in each of the semiconductor chips 100.

Then, before the semiconductor wafer 40 is separated into individual semiconductor chips 100, the groove 500 is formed between the first inductor 112 and the second inductor 122 using laser dicing.

Then, as illustrated in FIG. 33B, the semiconductor wafer 40 is separated into the plurality of semiconductor chips 100 using the dicing blade.

Then, as illustrated in FIG. 34, the semiconductor chip 100 is mounted on the interconnect substrate 200. Then, the semiconductor chip 100 and the interconnect substrate 200 are connected using the bonding wire 300. Then, the first surface of the interconnect substrate 200, the bonding wire 300, and the semiconductor chip 100 are sealed using the sealing resin 400. At this time, the sealing resin 400 is filled in the groove 500. The sealing resin 400, for example, is epoxy resin.

Even in this embodiment, the same effect as the first embodiment can be obtained. Further, the grove 500 is formed in advance when the semiconductor chip 100 is formed. This allows improving the position accuracy of the groove 500.

Since the laser dicing is used, the width of the groove 500 can be reduced. This allows the first inductor 112 and the second inductor 122 to be close to each other, thus strengthening the bonding of the two inductors.

The sealing resin 400 is filled in the groove 500. This allows improving the bonding strength of the first inductor 112 and the second inductor 122, in comparison to the case where the sealing resin 400 is not installed in the groove 500.

(Seventeenth Embodiment)

Figure 35:
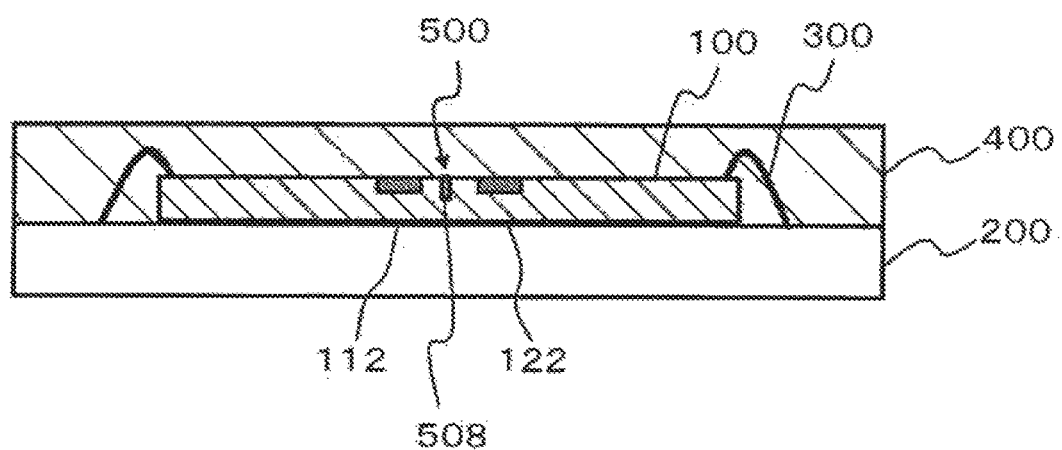
FIG. 35 is a cross-sectional view illustrating the configuration of a semiconductor device according to a seventeenth embodiment.

FIG. 35 is a cross-sectional view illustrating the configuration of a semiconductor device according to a seventeenth embodiment. The semiconductor device according to this embodiment has the same configuration as the semiconductor device according to the sixteenth embodiment except for the point that a resin 508 is buried in the groove 500.

The resin 508 is a different material from the sealing resin 400, and has a different magnetic permeability from the sealing resin 400. For example, the resin 508 may be any one of $SiO_2$, SiN, SiON, MSQ, and HSQ.

The method of manufacturing the semiconductor device according to this embodiment is the same as the semiconductor device according to the sixteenth embodiment except for the point that the resin 508 is buried in the groove 500 before the sealing resin 400 is formed after the groove 500 is formed.

Even in this embodiment, the same effect as the sixteenth embodiment can be obtained. Further, the resin 508 has a high degree of freedom in selecting the material against the sealing resin 400. This allows the bonding strength of the first inductor 112 and the second inductor 122 to be higher rather than that according to the sixteenth embodiment.

In this embodiment, before the semiconductor wafer 40 is separated into the plurality of semiconductor chip 100, the resin 508 may be filled in the groove 500. This can result in preventing foreign substances such as sawdust from entering into the groove 500 when the semiconductor wafer 40 is separated into the semiconductor chips 100.

(Eighteenth Embodiment)

Figure 36A:
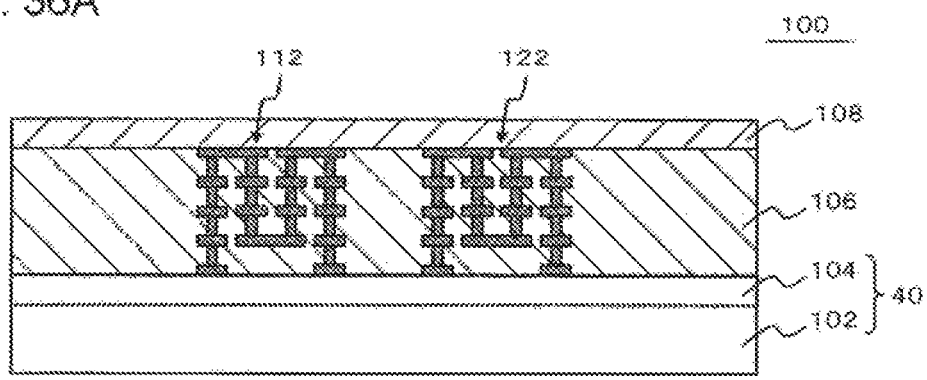
FIGS. 36A and 36B are cross-sectional views illustrating a method of manufacturing a semiconductor device according to an eighteenth embodiment.
Figure 36B:
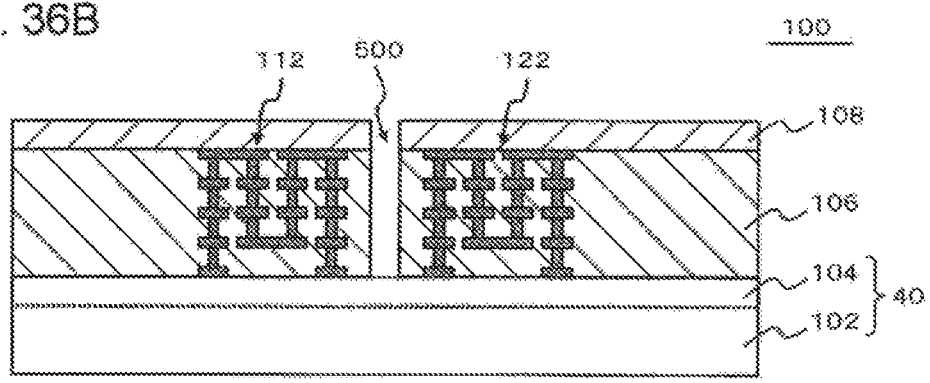

FIGS. 36A and 36B are cross-sectional views illustrating a method of manufacturing a semiconductor device according to an eighteenth embodiment. The method of manufacturing the semiconductor device according to this embodiment is equal to the semiconductor device according to the first embodiment except for the timing for forming the groove 500 and a method of forming the groove 500.

In this embodiment, the groove 500 is formed by a process of forming the element layer 104, the multilayer interconnect layer 106, and the passivation film 108 on the semiconductor wafer 40, that is, a pre-process.

Specifically, as illustrated in FIG. 36A, a plurality of transistors are formed on the semiconductor wafer 40. Then, the multilayer interconnect layer 106 is formed on the transistors and the semiconductor wafer 40. In this case, the first inductor 112 and the second inductor 122 are formed on the multilayer interconnect layer 106. Then, the passivation film 108 is formed on the multilayer interconnect layer 106.

Then, as illustrated in FIG. 36B, a mask pattern (not illustrated) is formed on the passivation film 108 and the multilayer interconnect layer 106. Then, the passivation film 108 and the multilayer interconnect layer 106 are etched using the mask pattern as a mask. Here, it is preferable that the etching is an anisotropic etching. Thus, the groove 500 is formed on the passivation layer 108 and the multilayer interconnect layer 106.

Figure 37A:
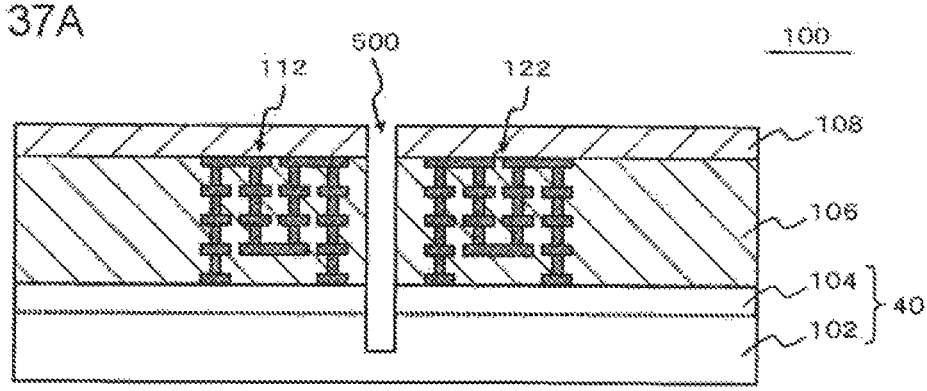
FIGS. 37A and 37B are views illustrating a modified example of FIGS. 36A and 36B.
Figure 37B:
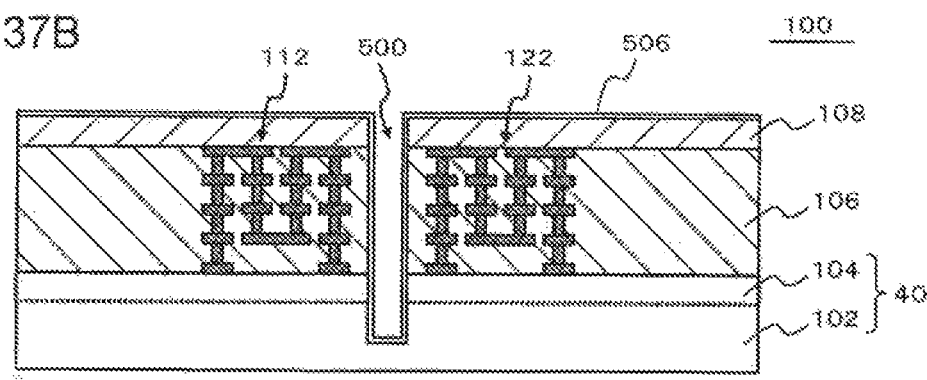

At this time, as illustrated in FIG. 37A, the bottom portion of the grove 500 may enter into the semiconductor wafer 40. Further, as illustrated in FIG. 37B, at least the side surface of the groove 500 may be covered by an insulating film 506. The insulating film 506, for example, may be made of $SiO_2$, SiN, and SiON. The insulating film 506, for example, is formed by performing a CVD method or an ALD method after the groove 500 is formed. In this case, the insulating film 506 is formed on the bottom surface of the groove 500 and the passivation film 108. By forming the insulating film 506, moisture or the like does not penetrating from the side surface of the groove 500 into the inside of the multilayer interconnect layer 106.

Even in this embodiment, the same effect as the first embodiment can be obtained. Further, since the groove 500 is formed by etching, the width of the groove 500 can be reduced. This allows the first inductor 112 and the second inductor 122 to be close to each other, thus strengthening the bonding of the two inductors. The anisotropic etching may be used as the etching when forming the groove 500, in order to further reduce the width of the groove 500.

(Nineteenth Embodiment)

Figure 38:
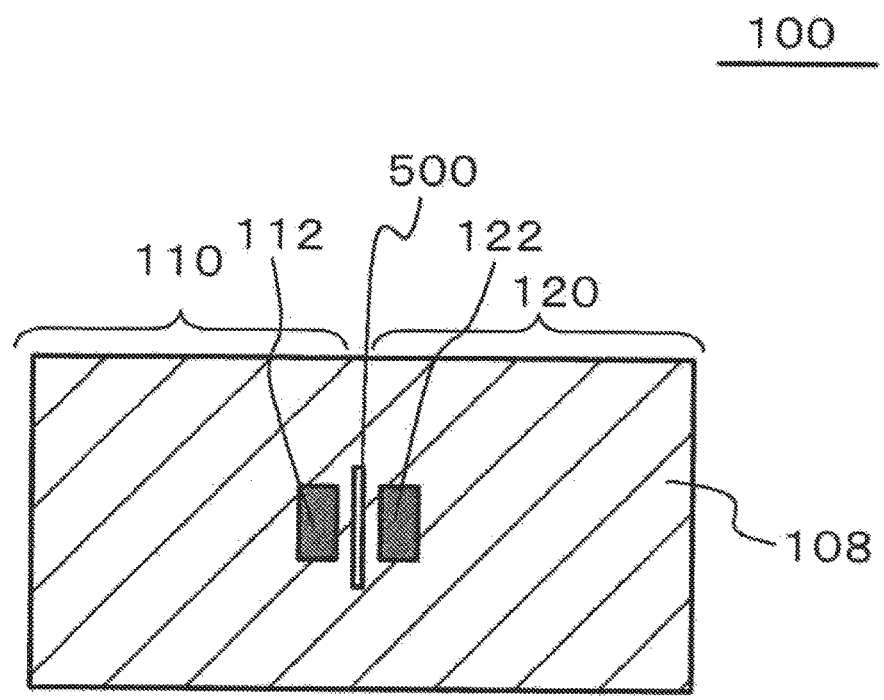
FIG. 38 is a plan view illustrating the configuration of a semiconductor chip according to a nineteenth embodiment.

FIG. 38 is a plan view illustrating the configuration of a semiconductor chip 100 according to a nineteenth embodiment. The semiconductor chip 100 according to this embodiment is the same as any one of sixteenth embodiment to eighteenth embodiment except for the point that the groove 500 is formed only between the first inductor 112 and the second inductor 122, and does not extend up to the edge of the semiconductor chip 100.

Even in this embodiment, the same effect as any one of the sixteenth to eighteenth embodiments can be obtained. Further, since the groove 500 is formed only between the first inductor 112 and the second inductor 122, the strength of the semiconductor device can be increased.

In this embodiment, the groove 500 may be formed by etching (for example, anisotropic etching), in order to improve accuracy of length and position for the groove 500. This can result in reducing the margin between the groove 500 and the circuit area (in the case of an element such as a transistor or the like, an area in which a interconnect is formed) that is positioned around the groove 500, thus increasing the circuit area. Accordingly, the layout limitations when designing the semiconductor chip 100 can be reduced.

(Twentieth Embodiment)

Figure 39:
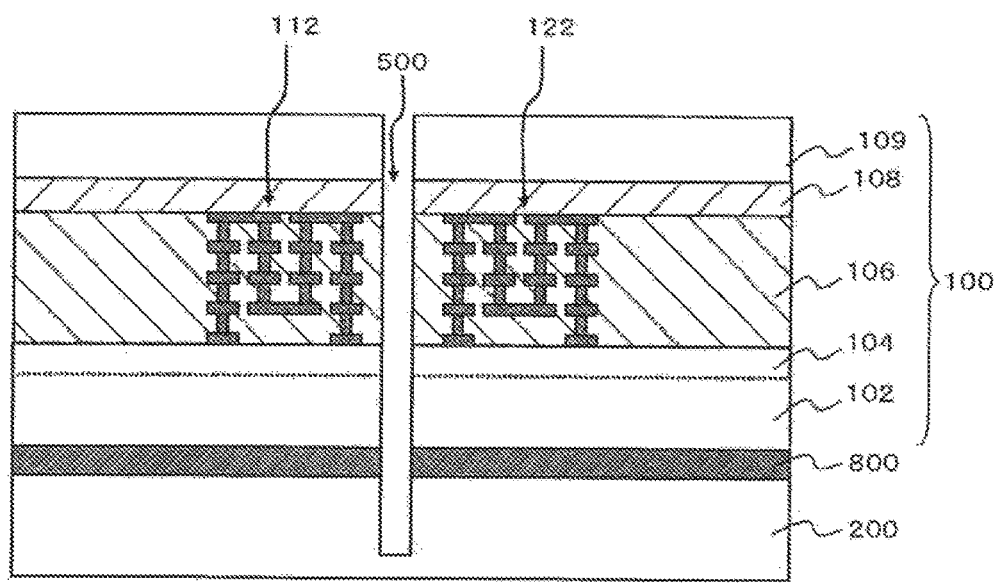
FIG. 39 is a view illustrating the configuration of a semiconductor device according to a twentieth embodiment.

FIG. 39 is a view illustrating the configuration of a semiconductor device according to a twentieth embodiment. In this embodiment, the semiconductor chip 100 has a polyimide film 109 formed on the passivation film 108. The polyimide film 109 has an opening on an electrode pad (not illustrated) installed on the multilayer interconnect layer 106.

The semiconductor chip 100 is fixed to the interconnect substrate 200 through a fixing layer 800. The fixing layer 800 may be made of silver paste or DAF.

The groove 500 is installed in an area in which an opening is not formed on the polyimide film 109. The bottom surface of the groove 500 enters into the interconnect substrate 200. In this case, the groove 500, for example, is formed using the dicing blade 510.

Even in this embodiment, the same effect as the first embodiment can be obtained. Further, the dicing blade 510 forms the groove 500 on a portion of the polyimide film 109 on which the opening is not formed. This can result in preventing a defect from entering into the multilayer interconnect layer 106 when the groove 500 is formed. This allows preventing the interconnect in the multilayer interconnect layer 106 from being short-circuited.

(Twenty-first Embodiment)

Figure 40:
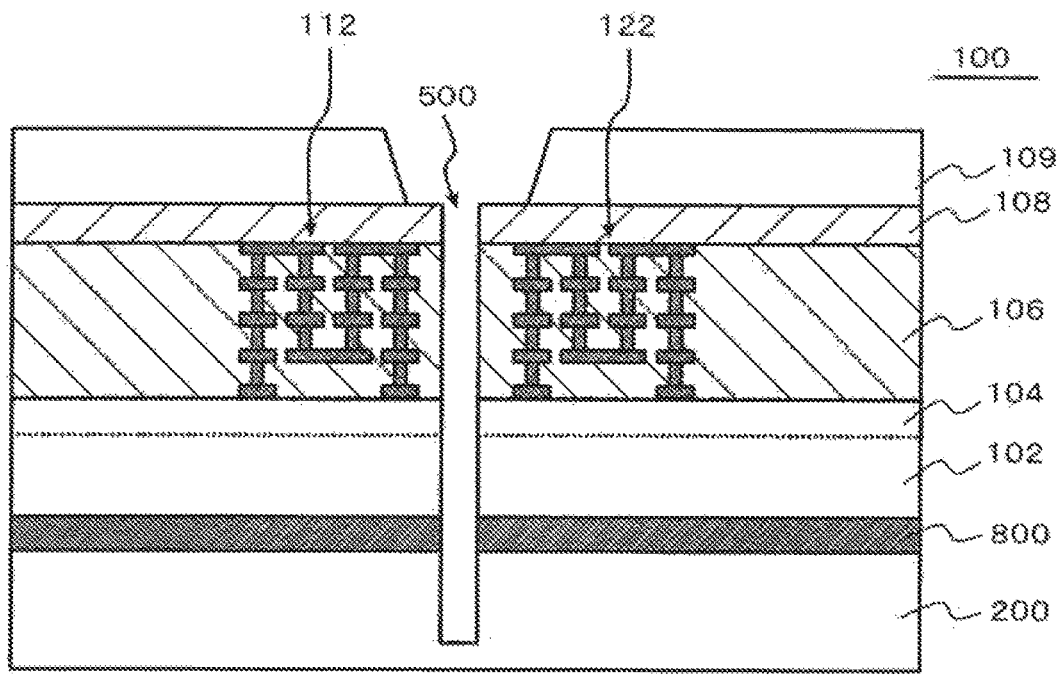
FIG. 40 is a view illustrating the configuration of a semiconductor device according to a twenty-first embodiment.

FIG. 40 is a view illustrating the configuration of a semiconductor device according to a twenty-first embodiment. The semiconductor device according to this embodiment has the same configuration as the semiconductor device according to the twentieth embodiment except for the point that a portion of the polyimide film 109 on which the groove 500 is formed has an opening.

Even in this embodiment, the same effect as the first embodiment can be obtained. Further, since it is not necessary for the dicing blade 510 to cut the polyimide film 109 when the groove 500 is formed, the polyimide film 109 can prevent its cutting waste from entering into the groove 500.

Position of the grove 500 can be performed based on the opening of the polyimide film 109 when the groove 500 is formed. This results in improving the position accuracy for the groove 500. Further, since the opening of the polyimide film 109 and the groove 500 allow visually confirming whether or not they overlap each other after the groove 500 is formed, the position of the groove 500 can be easily inspected.

(Twenty-second Embodiment)

Figure 41A:
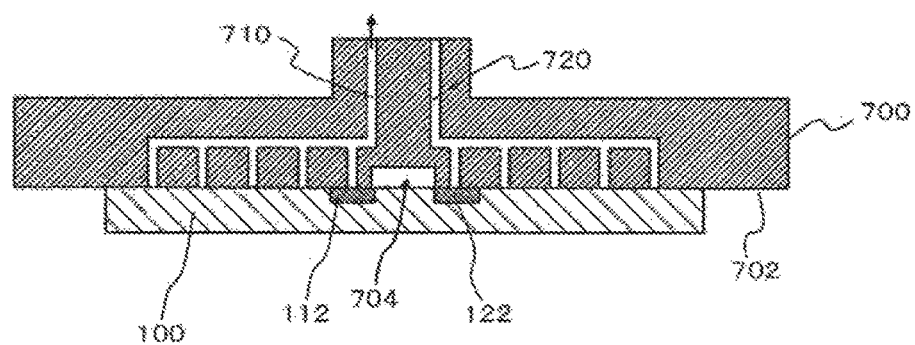
FIGS. 41A and 41B are cross-sectional views illustrating a method of manufacturing a semiconductor device according to a twenty-second embodiment.
Figure 41B:
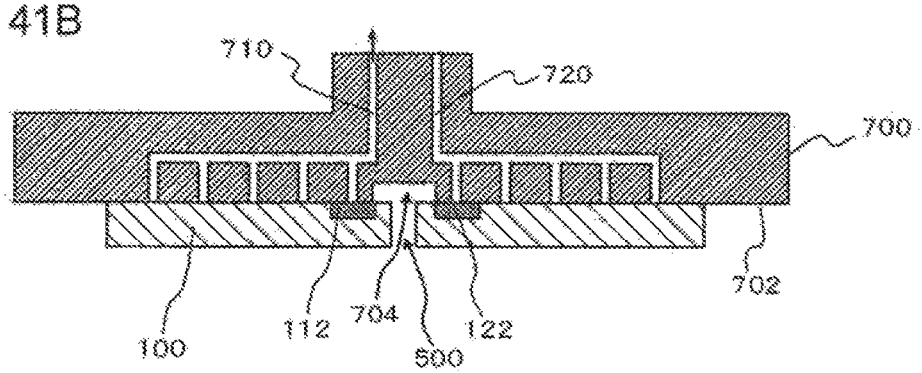
Figure 42:
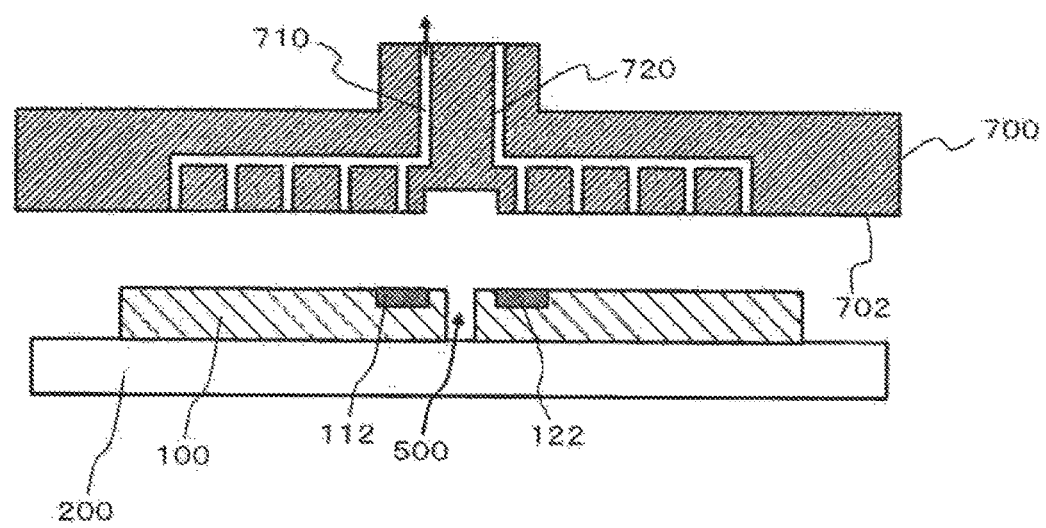
FIG. 42 is a cross-sectional view illustrating a method of manufacturing a semiconductor device according to a twenty-second embodiment.

FIGS. 41A and 41B and 42 are cross-sectional views illustrating a method of manufacturing a semiconductor device according to a twenty-second embodiment. First, as illustrated in FIG. 41A, the semiconductor chip 100 is adsorbed on the adsorption surface 702 of the adsorption device 700. On the adsorption surface 702 of the adsorption device 700, a concave portion 704 is formed. The concave portion 704 is positioned between the first inductor 112 and the second inductor 122 as seen from the plane. In an example illustrated in this drawing, the active surface of the semiconductor chip 100 is adsorbed on the adsorption surface 702. However, in the case where the semiconductor chip 100 is flip-chip-mounted on the interconnect substrate 200, the rear surface of the semiconductor chip 100 may be adsorbed on the adsorption surface 702.

Then, as illustrated in FIG. 41B, for example, the groove 500 is formed on the semiconductor chip 100 using the dicing blade (not illustrated). Since the concave portion 704 is formed on the adsorption surface 702, the dicing blade hardly contacts with the adsorption device 700. In this case, the groove 500 penetrates the semiconductor chip 100.

Then, as illustrated in FIG. 42, the semiconductor chip 100 is mounted on the interconnect substrate 200 using the adsorption device 700. In this case, the lead frame 220 may be used instead of the interconnect substrate 200. Thereafter, the bonding wire 300 and the sealing resin 400 are formed.

At this time, in a state as illustrated in FIG. 41A, DAF may be installed on the rear surface of the semiconductor chip 100. This allows, in the case where the semiconductor chip 100 is divided into two by the groove 500, preventing changing heights of the two divided pieces each other when the semiconductor chip 100 is mounted on the interconnect substrate 200.

Even in this embodiment, the same effect as the first embodiment can be obtained. Even when the semiconductor chip 100 is divided into two pieces, the two pieces can prevent changing their heights each other. This allows preventing weakening the bonding of the first inductor 112 and the second inductor 122.

In this embodiment, the upper surface of the semiconductor chip 100 may be fixed to a fixing member (not illustrated) rather than the adsorption device 700. In this case, the groove 500 is formed in a state where the semiconductor chip 100 is fixed to the fixing member. Thus, the semiconductor chip 100 fixed to the fixing member is mounted on the interconnect substrate 200. Even in this case, the semiconductor chip 100 can prevent, when it is divided into two pieces, heights of the two pieces from being changed. This allows preventing weakening the bonding of the first inductor 112 and the second inductor 122.

(Twenty-third Embodiment)

Figure 43A:
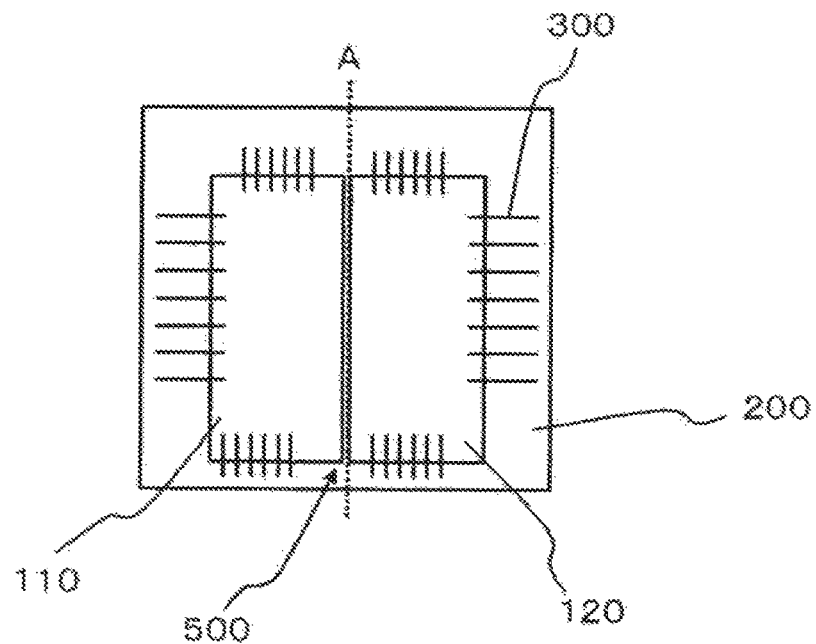
FIG. 43A is a plan view illustrating the configuration of a semiconductor device according to a twenty-third embodiment.
Figure 43B:
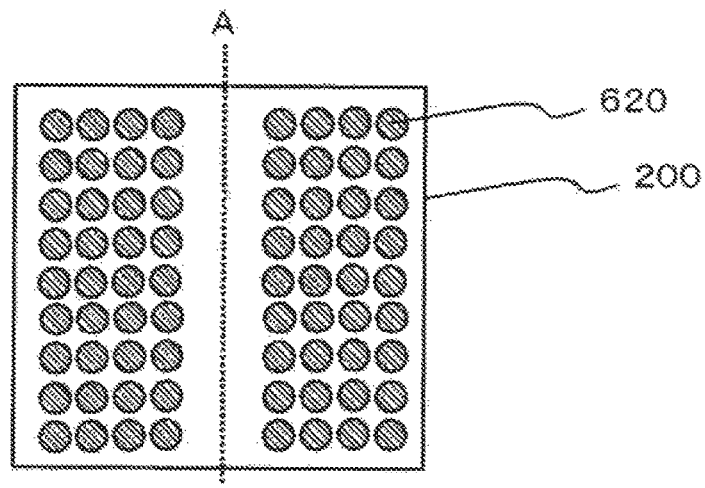
FIG. 43B is a rear view of the semiconductor device.

FIG. 43A is a plan view illustrating the configuration of a semiconductor device according to a twenty-third embodiment. FIG. 43B is a rear view of the semiconductor device. The semiconductor device according to this embodiment includes the semiconductor chip 100, the bonding wire 300, and the interconnect substrate 200. In this semiconductor device, soldering balls 620 are shaped in the form of a lattice. The semiconductor chip 100 and the interconnect substrate 200 are all rectangular, and the sides that are opposite to each other are in parallel to each other. Further, the centers of the semiconductor chip 100 and the interconnect substrate 200 overlap each other. The groove 500 passes the centers of the semiconductor chip 100 and the interconnect substrate 200. As seen from the plane, on a straight line A on which the groove 500 passes and on lattice points positioned around the straight line, the soldering ball 620 is not formed. Further, around the four corner portions of the interconnect substrate 200, the soldering balls 620 are arranged.

Thus, the soldering ball 620 that connects to the first circuit area 110 may be spaced apart from the soldering ball 620 that connects to the second circuit area 120. This allows increasing the withstanding voltage between the first circuit area 110 and the second circuit area 120, and also suppressing the first circuit area 110 and the second circuit area 120 from interfering with each other.

The number of soldering balls 620 that are arranged along the side (the side in upward and downward directions in the drawing) that is in parallel to the straight line A of the interconnect substrate 200 is larger than the number of soldering balls 620 that are arranged along the side (the side in left and right directions in the drawing) that is perpendicular to the straight line A of the interconnect substrate 200. That is, the soldering balls 620 that are arranged along the side (the side in the left and right directions in the drawing) that is in parallel to the straight line A in the interconnect substrate 200 are not reduced. This allows preventing reducing the number of soldering balls 620 that can be arranged on the rear surface of the interconnect substrate 200.

The soldering balls 620 are arranged in line symmetry based on the straight line A. In this case, part of the soldering balls 620 may be dummy in order to secure the line symmetry. This allows in, even in the case where a thermal history is applied to the semiconductor device when the groove 500 is formed, providing the reproducibility against the bending of the semiconductor device due to the thermal history. That is, variation hardly occurs in the bending of the semiconductor device.

Figure 44A:
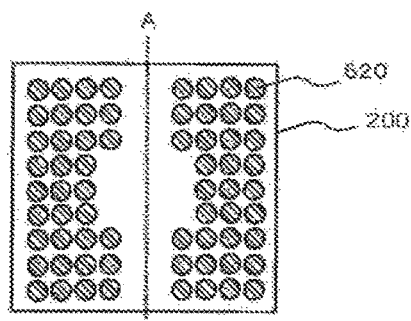
FIGS. 44A to 44C are views illustrating a modified example of FIG. 43B.
Figure 44B:
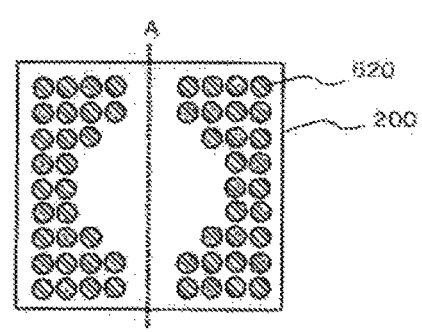
Figure 44C:
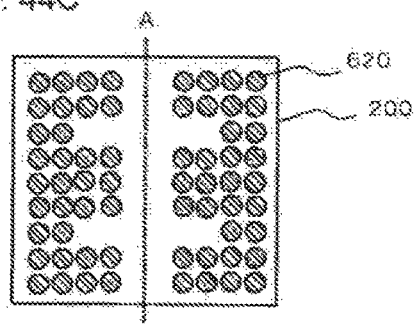
Figure 45A:
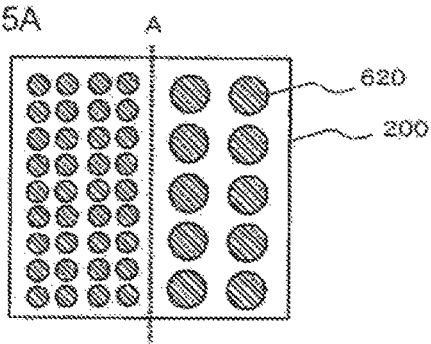
FIGS. 45A to 45D are views illustrating a modified example of FIG. 43B.
Figure 45B:
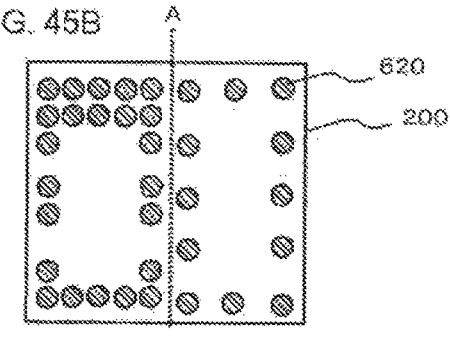
Figure 45C:
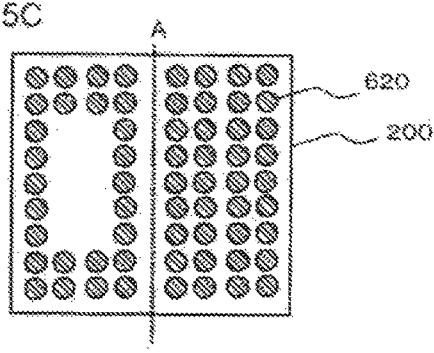
Figure 45D:
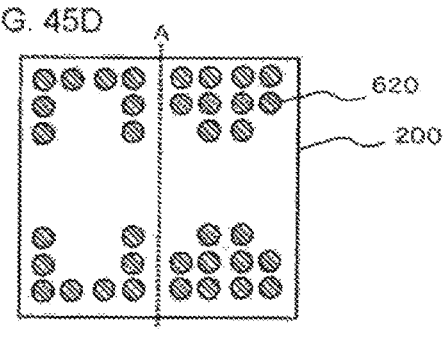

In this case, the layout of the soldering balls 620 may be as shown in FIGS. 44A to 44C. In these examples, in addition to the example as illustrated in FIG. 43B, part of the soldering balls 620 that are positioned relatively on the center side of the interconnect substrate 200 is reduced. Particularly in examples as illustrated in FIGS. 44A and 44B, as seen from the plane, the soldering balls 620 are not arranged on a portion that overlaps the center of the semiconductor chip 100. In any one of the examples, the soldering balls 620 are arranged in line symmetry based on the straight line A.

In examples as illustrated in FIGS. 45A to 45D, the regularity of the arrangement of the soldering balls 620 differs in an area that is positioned below the first circuit area 110 and in an area that is positioned below the lead frame 220. For example, in an example illustrated in FIG. 45A, the soldering balls 620 positioned in one area is different in number and size from the soldering balls 620 positioned in another area. Further, in examples illustrated in FIGS. 45B to 45D, the sizes of the soldering balls 620 are the same, but arrangement densities differ from one another. In any one of the examples, as seen from the respective areas, the soldering balls 620 are arranged in line symmetry based on the straight line that is in parallel to the straight line A. Also, in examples illustrated in FIGS. 45C and 45D, the soldering balls 620 are arranged in line symmetry based on the perpendicular bisector of the straight line A.

It is sometimes required to apply different design rules in an area that corresponds to the first circuit area 110 and in an area that corresponds to the second circuit area 120 of the interconnect substrate 200. Even in such a case, according to an example illustrated in FIGS. 45A to 45D, since the soldering balls 620 are arrange in line symmetry for each area, the routing of the interconnects in the respective areas is facilitated.

(Twenty-fourth Embodiment)

Figure 46A:
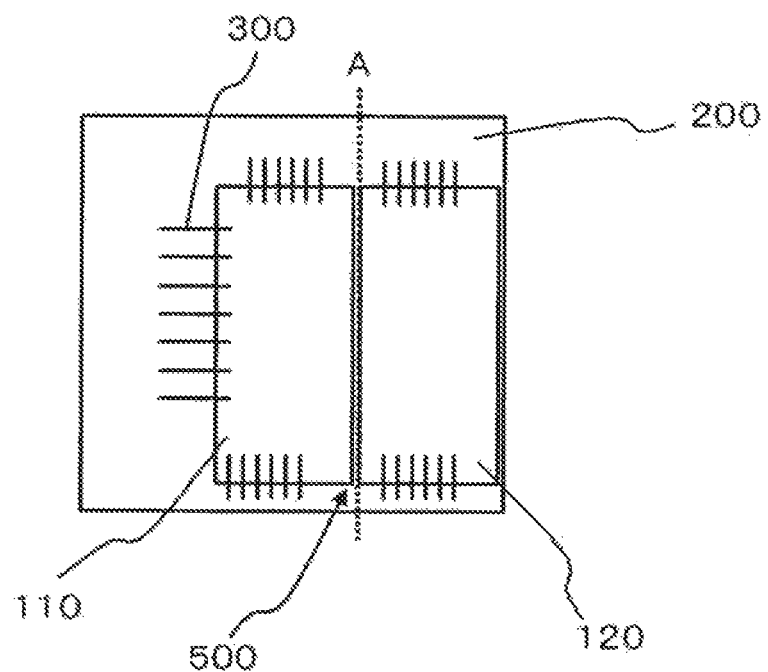
FIG. 46A is a plan view illustrating the configuration of a semiconductor device according to a twenty-fourth embodiment.
Figure 46B:
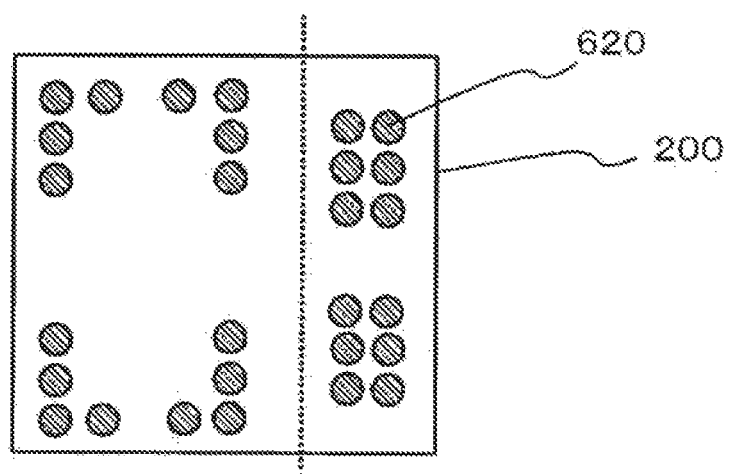
FIG. 46B is a rear view of the semiconductor device.
Figure 47A:
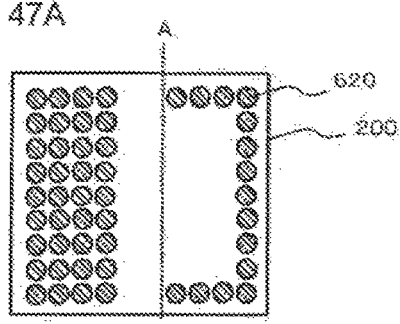
FIGS. 47A to 47D are views illustrating a modified example of FIG. 46B.
Figure 47B:
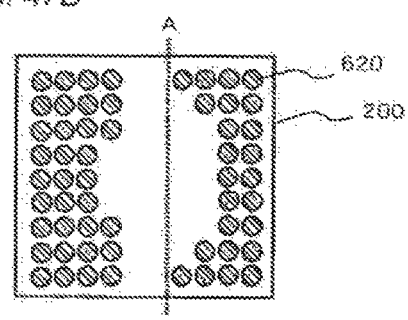
Figure 47C:
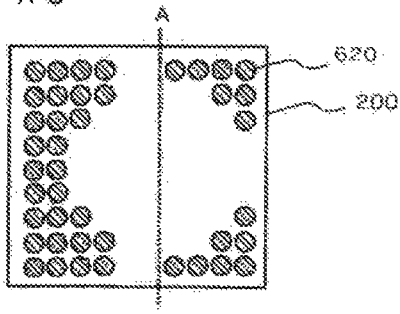
Figure 47D:
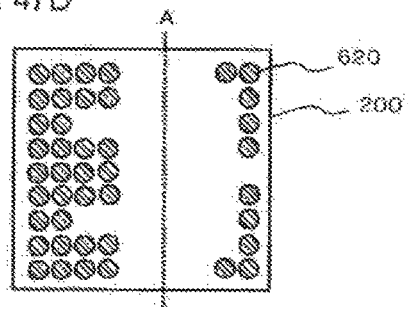

FIG. 46A is a plan view illustrating the configuration of a semiconductor device according to a twenty-fourth embodiment. FIGS. 46B and 47A to 47D are rear views of the semiconductor device. The semiconductor device according to this embodiment is the same as the semiconductor device according to the twenty-third embodiment except for the following point.

First, the centers of the semiconductor device 100 and the interconnect substrate 200 have missed, and thus the groove 500 has missed from the center of the interconnect substrate 200. However, the soldering balls 620 are arranged in line symmetry based on the perpendicular bisector of the straight line A in the area that corresponds to the first circuit area 110 and in the area that corresponds to the second circuit area 120. Further, in an example illustrated in FIG. 46B, even based on the line that is in parallel to the straight line A, the soldering balls 620 are arranged in line symmetry in the area that corresponds to the first circuit area 110 and in the area that corresponds to the second circuit area 120. Because of this, even in the case where it is required to apply different design rules in the area that corresponds to the first circuit area 110 and in the area that corresponds to the second circuit area 120, the routing of the interconnects in the respective areas is facilitated.

(Twenty-fifth Embodiment)

Figure 48A:
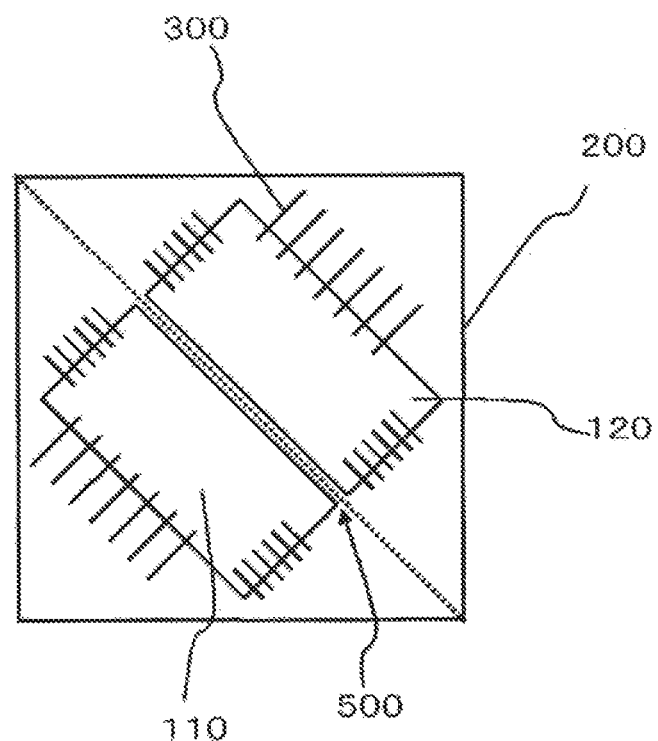
FIGS. 48A and 48B are views illustrating the configuration of a semiconductor device according to a twenty-fifth embodiment.

FIG. 48A is a view illustrating the configuration of a semiconductor device according to a twenty-fifth embodiment. In this embodiment, the semiconductor chip 100 is slantingly arranged with respect to the interconnect substrate 200. Further, the groove 500 is arranged on a diagonal line of the interconnect substrate 200.

Figure 48B:
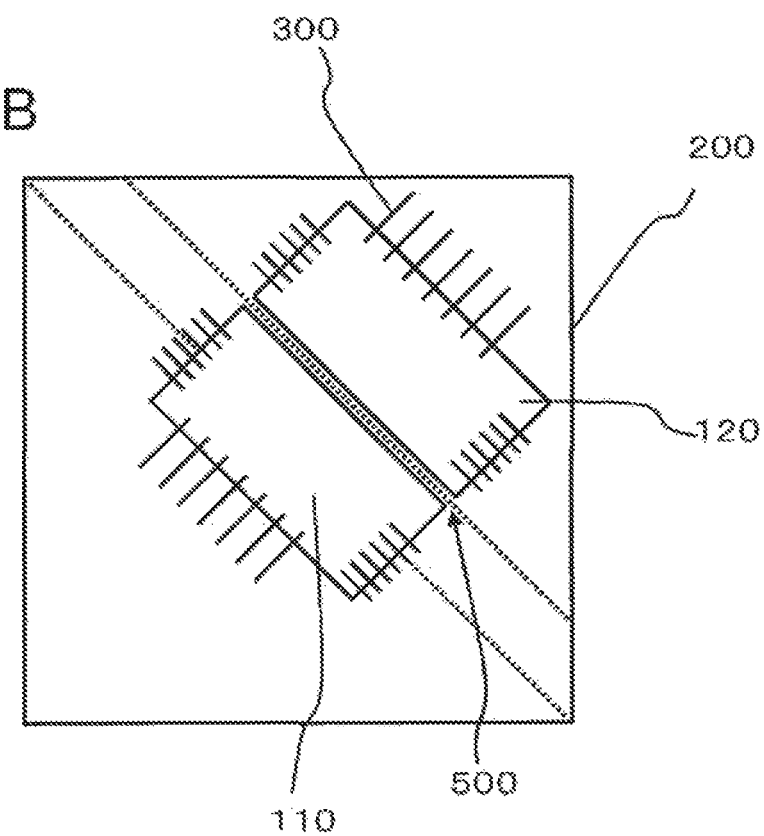

As illustrated in FIG. 48B, the groove 500 may be in parallel to the diagonal line of the interconnect substrate 200.

In the case of forming the groove 500 after mounting the semiconductor chip 100 on the interconnect substrate 200, this embodiment allows easily determining the position on which the groove 500 is formed, that is, the position through which the dicing blade 510 passes. In the case of mounting the groove 500 on the interconnect substrate 200 after forming the groove 500 on the semiconductor chip 100, the embodiment allows improving the accuracy of the position for placing the semiconductor chip 100.

(Twenty-sixth Embodiment)

Figure 49:
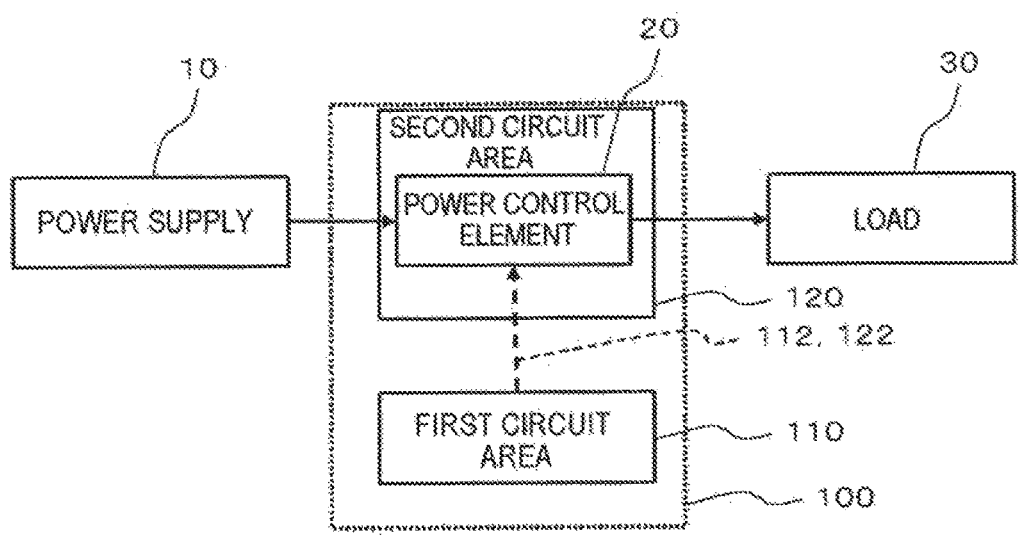
FIG. 49 is a functional block diagram of an electronic apparatus having a semiconductor chip according to a twenty-sixth embodiment.

FIG. 49 is a functional block diagram of an electronic apparatus having the semiconductor chip 100. The semiconductor chip 100 is mounted on the interconnect substrate 200 by the structure illustrated in any one of the above-described embodiments. In the second circuit area 120 of the semiconductor chip 100, a power control element 20 is formed. The power control element 20 controls power that is supplied from a power supply 10 to a load 30.

The circuit that is positioned in the first circuit area 110 of the semiconductor chip 100 is a circuit for controlling the power control element 20. Here, the generated signal is transferred to the power control element 20 through the first inductor 112 and the second inductor 122.

As described above, although embodiments of the invention have been described with reference to the drawings, they are exemplary, and diverse configurations may be adopted in addition to the above-described configurations.

It is apparent that the present invention is not limited to the above embodiment, and may be modified and changed without departing from the scope and spirit of the invention.

What is claimed is:

1. A semiconductor device comprising:
   a wiring substrate of a substantially rectangular shape having a first surface and a second surface opposite the first surface, a first side, a second side opposite the first side, a third side and a fourth side, which intersect the first and second sides, a plurality of electrode pads formed on the first surface, and a plurality of soldering balls formed on the second surface;
   the plurality of electrode pads including a plurality of first electrode pads closer to the first side than the second side and a plurality of second electrode pads closer to the second side than the first side;
   the second surface having a first area which is closer to the first side than the second side and which is contiguous to the first, third and fourth sides, a second area which is closer to the second side than the first side and which is contiguous to the second, third and fourth sides, and a third area which is contiguous to the first and second areas, and the third and fourth sides;
   the plurality of soldering balls including a plurality of first soldering balls which are shaped in a form of a lattice and which are on the first area, and a plurality of second soldering balls which are shaped in a form of a lattice and which are on the second area;
   the plurality of first soldering balls electrically connected with the plurality of the first electrode pads of the wiring substrate;
   the plurality of second soldering balls electrically connected with the plurality of the second electrode pads of the wiring substrate;
   a first semiconductor chip of a substantially rectangular shape having a first main surface, a first side surface, a second side surface opposite the first side surface, and a first inductor which is closer to the first side surface than the second side surface and which is on the first main surface;
   the first semiconductor chip being mounted on the first surface of the wiring substrate and closer to the first side of the wiring substrate than the second side of the wiring substrate;
   a second semiconductor chip of a substantially rectangular shape having a second main surface, a third side surface, a fourth side surface opposite the third side surface, and a second inductor which is closer to the third side surface than the fourth side surface and which is on the second main surface;
   the second semiconductor chip being mounted side by side with the first semiconductor chip on the first surface of the wiring substrate and closer to the second side of the wiring substrate than the first side of the wiring substrate such that the third side surface faces the first side surface of the first semiconductor chip;
   a plurality of bonding wires including a plurality of first bonding wires by which the first main surface of the first semiconductor chip is connected with the plurality of first electrode pads of the wiring substrate, and a plurality of second bonding wires by which the second main surface of the second semiconductor chip is connected with the plurality of second electrode pads of the wiring substrate; and
   a sealed resin body covering the first surface of the wiring substrate, the first semiconductor chip, the second semiconductor chip, and the plurality of bonding wires,
   wherein, in the plan view, the plurality of first soldering balls include a first ball that is most proximate to the second side of the wiring substrate in the plurality of first soldering balls,
   wherein, in the plan view, the plurality of second soldering balls include a second ball that is most proximate to the first side of the wiring substrate in the plurality of second soldering balls,
   wherein a shortest distance between the first and second soldering balls is greater than a shortest distance from the first side surface of the first semiconductor chip and the third side surface of the second semiconductor chip in the plan view,
   wherein, in the plan view, an area between the first side surface of the first semiconductor chip and the third side surface of the second semiconductor chip on the first surface of the wiring substrate is within the third area of the wiring substrate,
   wherein a soldering ball is not in the third area of the wiring substrate;
   wherein the first inductor of the first semiconductor chip is not electrically connected with the second inductor of the second semiconductor chip,
   wherein the first semiconductor chip is not electrically connected with the second semiconductor chip via a bonding wire in the plan view, and
   wherein the first soldering ball is not electrically connected with the second soldering ball.

2. The semiconductor device according to claim 1, wherein the first semiconductor chip is inputted a different reference electric potential from that of the second semiconductor chip.

3. The semiconductor device according to claim 2, wherein a difference between the reference electric potential given to the first semiconductor chip and the reference electric potential given to the second semiconductor chip is more than 100V.

4. The semiconductor device according to claim 1,
wherein the first semiconductor chip further includes a first circuit for transferring electric signals,
wherein the second semiconductor chip further includes a second circuit for receiving signals,
wherein the first circuit is electrically connected with the first inductor,
wherein the second circuit is electrically connected with the second inductor, and
wherein the first and second circuits are electrically isolated from each other.

5. The semiconductor device according to claim 1,
wherein soldering balls more than two rows are arranged in a first direction along the third side of the wiring substrate in each of the first and second areas of the wiring substrate, and
wherein the number of soldering balls that are arranged in a second direction that is perpendicular to the first direction is larger than the number of soldering balls that are arranged in the first direction in each of the first and second areas of the wiring substrate in the plan view.

6. The semiconductor device according to claim 1,
wherein the plurality of first soldering balls are included in a first soldering ball group which on the first area of the wiring substrate,
wherein the plurality of the second soldering balls are included in a second soldering ball group on the second area of the wiring substrate, and
wherein a shortest distance from the first and second soldering ball groups is greater than the shortest distance from the first surface of the first semiconductor chip and the third side surface of the second semiconductor chip in the plan view.

7. The semiconductor device according to claim 1, wherein the regularity of the arrangement of the first soldering balls is substantially equal to the regularity of the arrangement of the second soldering balls in the plan view.

8. The semiconductor device according to claim 1, wherein a number of windings and a winding axis direction of the first inductor of the first semiconductor chip are substantially equal to a number of windings and a winding axis direction of the second inductor of the second semiconductor chip.

9. The semiconductor device according to claim 1,
wherein the sealed resin body further includes an upper surface and a rear surface opposite the upper surface,
wherein the upper surface faces the first main surface of the first semiconductor chip and the second main surface of the second semiconductor chip,
wherein the first and second main surface are closer to the upper surface than the rear surface, and
wherein a distance from the upper surface to the first inductor of the first semiconductor chip is substantially equal to a distance from the upper surface to the second inductor of the second semiconductor chip in a thickness direction of the wiring substrate.

10. A semiconductor device comprising:
a wiring substrate of a substantially rectangular shape having a first surface and a second surface opposite the first surface, a first side, a second side opposite the first side, a third side and a fourth side, which intersect the first and second sides, a plurality of electrode pads formed on the first surface, and a plurality of soldering balls formed on the second surface;
the plurality of electrode pads including a plurality of first electrode pads closer to the first side than the second side and a plurality of second electrode pads closer to the second side than the first side;
the second surface having a first area which is closer to the first side than the second side and which is contiguous to the first, third and fourth sides, a second area which is closer to the second side than the first side and which is contiguous to the second, third and fourth sides, and a third area which is contiguous to the first and second area, and the third and fourth sides;
the plurality of soldering balls including a plurality of first soldering balls which are shaped in a form of a lattice and which are on the first area, and a plurality of second soldering balls which are shaped in a form of a lattice and which are on the second area;
the plurality of first soldering balls being electrically connected with the plurality of the first electrode pads of the wiring substrate;
the plurality of second soldering balls being electrically connected with the plurality of the second electrode pads of the wiring substrate;
a first semiconductor chip of a substantially rectangular shape having a first main surface, a first side surface, a second side surface opposite the first side surface, and a first inductor which is closer to the first side surface than the second side surface and which is on the first main surface;
the first semiconductor chip being mounted on the first surface of the wiring substrate and closer to the first side of the wiring substrate than the second side of the wiring substrate;
a second semiconductor chip of a substantially rectangular shape having a second main surface, a third side surface, a fourth side surface opposite the third side surface, and a second inductor which is closer to the third side surface than the fourth side surface and which is on the second main surface;
the second semiconductor chip being mounted side by side with the first semiconductor chip on the first surface of the wiring substrate and closer to the second side of the wiring substrate than the first side of the wiring substrate such that the third side surface faces the first side surface of the first semiconductor chip;
a plurality of bonding wires including a plurality of first bonding wires by which the first main surface of the first semiconductor chip is connected with the plurality of first electrode pads of the wiring substrate, and a plurality of second bonding wires by which the second main surface of the second semiconductor chip is connected with the plurality of second electrode pads of the wiring substrate; and
a sealed resin body covering the first surface of the wiring substrate, the first semiconductor chip and the second semiconductor chip, and the plurality of bonding wires,
wherein, in the plan view, the plurality of first soldering balls include a first ball that is most proximate to the second side of the wiring substrate in the plurality of first soldering balls,
wherein, in the plan view, the plurality of second soldering balls include a second ball that is most proximate to the first side of the wiring substrate in the plurality of second soldering balls,
wherein, in the plan view, a distance between the first and second soldering balls is greater than a distance from the first side surface of the first semiconductor chip and the third side surface of the second semiconductor chip in a first direction along the third side of the wiring substrate, wherein, in the plan view, an area between the first side surface of the first semiconductor chip and the third side surface of the second semiconductor chip on the first surface of the wiring substrate is within the third area of the wiring substrate, wherein a soldering ball is not in the third area of the wiring substrate;

wherein the first inductor of the first semiconductor chip is not electrically connected with the second inductor of the second semiconductor chip, wherein the first semiconductor chip is not electrically connected with the second semiconductor chip via a bonding wire in the plan view, and wherein the first soldering ball is not electrically connected with the second soldering ball.

11. The semiconductor device according to claim 10, wherein soldering balls more than two rows are arranged in the first direction in each of the first and second areas of the wiring substrate, and wherein the number of soldering balls that are arranged in a second direction that is perpendicular to the first direction is larger than the number of soldering balls that are arranged in the first direction in each of the first and second areas of the wiring substrate in the plan view.

12. The semiconductor device according to claim 10, wherein the plurality of first soldering balls are included in a first soldering ball group on the first area of the wiring substrate, wherein the plurality of the second soldering balls are included in a second soldering ball group on the second area of the wiring substrate, and wherein a shortest distance from the first and second soldering ball groups is greater than the shortest distance from the first surface of the first semiconductor chip and the third side surface of the second semiconductor chip in the plan view.

13. The semiconductor device according to claim 10, wherein the regularity of the arrangement of the first soldering balls is substantially equal to the regularity of the arrangement of the second soldering balls in the plan view.

14. The semiconductor device according to claim 10, wherein a number of windings and a winding axis direction of the first inductor of the first semiconductor chip are substantially equal to a number of windings and a winding axis direction of the second inductor of the second semiconductor chip.

* * * * *